United States Patent
Martin et al.

(10) Patent No.: US 11,361,132 B2
(45) Date of Patent: Jun. 14, 2022

(54) SYSTEM AND METHOD FOR USING WEATHER APPLIED METRICS FOR PREDICTING THE FLIGHT OF A BALL

(71) Applicant: Martin Meter LLC, Orinda, CA (US)

(72) Inventors: William Martin, Orinda, CA (US); John Paul Farley, Lexington, SC (US); John Amirault Farley, Lexington, SC (US); Peter Jackson, Orinda, CA (US); Douglas Milton Sinton, Palo Alto, CA (US); Metin Ozen, Sunnyvale, CA (US)

(73) Assignee: Martin Meter LLC, Orinda, CA (US)

(*) Notice: Subject to any disclaimer, the term of this patent is extended or adjusted under 35 U.S.C. 154(b) by 0 days.

(21) Appl. No.: 17/182,102

(22) Filed: Feb. 22, 2021

(65) Prior Publication Data

US 2021/0182461 A1    Jun. 17, 2021

Related U.S. Application Data

(63) Continuation-in-part of application No. 15/951,057, filed on Apr. 11, 2018, now Pat. No. 11,052,285, (Continued)

(51) Int. Cl.
*G06F 30/28*  (2020.01)
*G01W 1/02*  (2006.01)

(52) U.S. Cl.
CPC .............. *G06F 30/28* (2020.01); *G01W 1/02* (2013.01)

(58) Field of Classification Search
CPC ................................ G06F 30/28; G01W 1/02
See application file for complete search history.

(56) References Cited

U.S. PATENT DOCUMENTS

| 5,558,333 A * | 9/1996 | Kelson ............... A63B 71/0672 |
|---|---|---|
| | | 473/131 |
| 2002/0143729 A1* | 10/2002 | Fostick .................. G06F 16/29 |

(Continued)

OTHER PUBLICATIONS

Sawicki et al., "How to Hit Home Runs: Optimum Baseball Bat Swing Parameters for Maximum Range Trajectories", American Association of Physics Teachers, http://baseball.physics.illinois.edu/AJP-Nov03.pdf, Jun. 12, 2002, 11 pages.

(Continued)

*Primary Examiner* — John E Breene
*Assistant Examiner* — Liam R Casey
(74) *Attorney, Agent, or Firm* — Beyer Law Group LLP

(57) ABSTRACT

A system and method for using weather applied metrics for determining the impact of weather conditions on the flight of a ball at an outdoor sports venue. Historical and current data for weather parameters, including wind, air pressure, humidity, temperature, and precipitation, are obtained to calculate the influence of each parameter on the flight of a ball. The influences of each of the parameters are summed to model the flight of the ball based on the current weather conditions. Weather instruments, such as weather sensors, anemometers, LiDAR and SODAR devices, weather consoles, data routing devices, and processors can be included in a system for using weather applied metrics to predict the flight of a ball based on current weather conditions.

20 Claims, 19 Drawing Sheets

Related U.S. Application Data which is a continuation-in-part of application No. 15/796,983, filed on Oct. 30, 2017, now abandoned.

(60) Provisional application No. 62/414,686, filed on Oct. 29, 2016.

(56) References Cited

U.S. PATENT DOCUMENTS

| | | | |
|---|---|---|---|
| 2005/0233815 | A1 | 10/2005 | McCreary et al. |
| 2007/0167247 | A1 | 7/2007 | Lindsay |
| 2013/0184089 | A1* | 7/2013 | Rauchholz ............. A63B 53/14 473/168 |
| 2013/0314694 | A1 | 11/2013 | Tchoryk, Jr. et al. |
| 2014/0327569 | A1 | 11/2014 | Fun et al. |
| 2017/0323236 | A1* | 11/2017 | Quintavalla ..... G06Q 10/06312 |
| 2017/0371074 | A1* | 12/2017 | Elkabetz ................ G01S 13/95 |
| 2018/0117400 | A1 | 5/2018 | Martin et al. |
| 2018/0229080 | A1 | 8/2018 | Martin et al. |
| 2020/0018666 | A1* | 1/2020 | Tang ....................... G06F 30/28 |

OTHER PUBLICATIONS

Kensrud, "Determining Aerodynamic Properties of Sports Balls in Situ", Washington State University, Department of Mechanical and Materials Engineering, http://baseball.physics.illinois.edu/KensrudThesis.pdf, Aug. 2010, 127 pages.

National Aeronautics and Space Administration, "Lift of a Baseball", https://www.grc.nasa.gov/www/k-12/airplane/balllift.html, May 2007, 2 pages.

Nathan, "The Effect of Spin on the Flight of a Baseball", Department of Physics, University of Illinois, Urbana, Illinois 61801, http://baseball.physics.illinois.edu/AJPFeb08.pdf, Jun. 27, 2007, 6 pages.

Clanet, "Sports Ballistics", Annual Review of Fluid Mechanics, http://baseball.physics.illinois.edu/clanet/ClanetSportsBallistics.pdf, Sep. 22, 2014, 26 pages.

Nathan, "Going Deep on Goin' Deep", The Hardball Times, https://tht.fangraphs.com/going-deep-on-goin-deep/, Apr. 6, 2016, 10 pages.

Russell, "Forces Between Bat and Ball", Graduate Program in Acoustics, Pennsylvania State University, https://www.acs.psu.edu/drussell/bats/impulse.htm, 2001-2011, 2 pages.

Werner, "Flight Model of a Golf Ball", http://www.users.csbsju.edu/~jcrumley/222_2007/projects/awwerner/project.pdf, Mar. 2007, 13 pages.

"Relationship Between Density, Pressure, and Temperature", http://msrc.sunysb.edu/~chang/atm205/Notes/Chapter_1_txtb.pdf, downloaded from the internet on Jan. 24, 2019, 7 pages.

Hampie, "1,000-foot Baseball Catch", https://mlblogssnaggingbaseballs.wordpress.com/2012/06/15/1000-foot-baseball-catch/, Jun. 15, 2012, 7 pages.

Kothmann, "Aerodynamics of Sports Balls", Annual Review of Fluid Mechanics, https://www.seas.upenn.edu/~meam211/slides/aero.pdf, Jan. 2007, 13 pages.

Alam et al., "A Study of Baseball and Softball Aerodynamics", SciVerse ScienceDirect, Procedia Engineering 34 (20120 86-91, https://ac.els-cdn.com/S1877705812016293/1-s2.0-S1877705812016293-main.pdf?_tid=f0325ef2-6a06-4cd7-b872-a3eb612c683a&acdnat=1548790839_859bf532733e01ae3cf4901e7754e515, Mar. 2, 2012, pp. 86-91.

Adair, "The Physics of Baseball", Physics Today, https://www.freewebs.com/anskyboy2/Physics%20of%20Baseball%20(Adair).pdf, May 26, 1995, 6 pages.

Fitzpatrick, "Air Drag", http://farside.ph.utexas.edu/teaching/329/lectures/node42.html, Mar. 29, 2006, 5 pages.

Kagan et al., "Simplified Models for the Drag Coefficient of a Pitched Baseball", The Physics Teacher, vol. 52, http://baseball.physics.illinois.edu/DragTPTMay2014.pdf, May 2014, 3 pages.

"Life's a Drag Crisis", https://thatsmaths.com/2015/11/26/lifes-a-drag-crisis/, Nov. 26, 2015, 3 pages.

Frohlich, "Aerodynamic Drag Crisis and its Possible Effect on the Flight of Baseballs", American Association of Physics Teachers, Am. J. Phys., vol. 52, No. 4, Institute for Geophysics, University of Texas at Austin, http://ww2.odu.edu/~agodunov/teaching/phys420/files/Frohlich.pdf, Apr. 1984, 10 pages.

Mehta, "Aerodynamics of Sports Balls", Ann. Rev. Fluid Mech., https://people.stfx.ca/smackenz/courses/HK474/Labs/Jump%20Float%20Lab/Mehta%201985%20Aerodynamics%20of%20sports%20balls.pdf, 1985, 17:151-89, 40 pages.

Brancazio, "The Physics of Kicking a Football", The Physics Teacher, http://citeseerx.ist.psu.edu/viewdoc/download?doi=10.1.1.694.2525&rep=rep1&type=pdf, Oct. 1995, 5 pages.

Horn et al., "On the Flight of the American Football", Physics Department, California State University Fullerton, https://physics.fullerton.edu/~heidi/PROJECTS/football.pdf, Jun. 4, 2007, 22 pages.

Penner, "The Physics of Golf", Institute of Physics Publishing, Reports on Progress in Physics 66 (2003) pp. 131-171, http://raypenner.com/golf-physics.pdf, Dec. 20, 2002.

Trackman, "Normalization Feature Explained", Jul. 9, 2014, https://web.archive.org/web/20140808093226/https://blog.trackmangolf/normalization-feature-explained, 9 pages.

Kemp, "Weather: A Major Factor", Aug. 2007, https://web.archive.org/web/20150831004156/https://www.golfdigest.com/story/gw070803pgaweather, 6 pages.

Alaways, "Aerodynamics of the Curve-Ball: An Investigation of the Effects of Angular Velocity on Baseball Trajectories", Jan. 1998 Dissertation, https://www.researchgate.net/publication/241376252_Aerodynamics_of_the_curveball_An_investigation_of_the_effects_of_angular_velocity_on_baseball_trajectories, 151 pages.

Jalilian et al., "Computational Aerodynamics of Baseball, Soccer Ball and Volleyball", American Journal of Sports Science, vol. 2, No. 5, pp. 115-121, doi: 10.11648/j.ajss.20140205.12, Sep. 20, 2014.

Kensrud et al., "Relating Baseball Seam Height to Carry Distance", Washington State University, Department of Mechanical and Materials Engineering, Procedia Engineering 112 (2015) pp. 406-411.

Robinson et al., "The Motion of an Arbitrarily Rotating Spherical Projectile and its Application to Ball Games", The Royal Swedish Academy of Sciences, vol. 88, No. 1, https://iopscience.iop.org/article/10.1088/0031-8949/88/01/018101;jsessionid=47C332E19E87E378510AA986E6E74A8D.c3.iopscience.cld.iop.org, Jul. 4, 2013, 18 pages.

De Mestre, "The Mathematics of Projectiles in Sport", School of Information and Computing Sciences, Bond University, Queensland, Australia, 1990, 38 relevant pages in total.

* cited by examiner

FIG. 8

SYSTEM AND METHOD FOR USING WEATHER APPLIED METRICS FOR PREDICTING THE FLIGHT OF A BALL

RELATED APPLICATION

This application is a Continuation-in-Part of U.S. patent application Ser. No. 15/951,057, filed on Apr. 11, 2018, which is a Continuation-in-Part of and claims the benefit of U.S. patent application Ser. No. 15/796,983, filed on Oct. 30, 2017, which claims the benefit of U.S. Provisional Patent Application No. 62/414,686, filed on Oct. 29, 2016, all of which are hereby incorporated by reference in their entirety for all purposes.

BACKGROUND

The present invention relates generally to weather factors in sports. More particularly, the present invention relates to a system and method for predicting the flight of a ball based on weather conditions at a particular location.

Weather has a significant impact on many sports, such as baseball, football, golf, etc. There is a significant amount of credible research that explains how weather impacts the balls used in all major sports in outdoor venues. Given the knowledge that weather can impact the flight of a ball, it would be desirable to have a system for predicting the flight of a ball in sports at a given location based on the current and future weather conditions.

SUMMARY

In accordance with an embodiment, a computer-implemented method is provided for determining an impact of weather parameters on a flight of a ball at an outdoor sports venue. A digital model of the outdoor sports venue is provided to a processor. At the processor, real-time data for at least one weather parameter at or near the outdoor sports venue is obtained. The at least one weather parameter is wind, and obtaining the real-time data comprises receiving the real-time data from a wireless communication network, where the wireless communication network collects the real-time data sourced from cellular transmission signals including signal attenuation information. At the processor, the obtained current data for the at least one weather parameter is inputted into a computational fluid dynamics (CFD) model. At the processor, the CFD model is used with the inputted current data and the digital model of the outdoor sports venue to produce three-dimensional wind vectors at grid-points in the digital model of the outdoor sports venue. At the processor, the three-dimensional wind vectors are used to calculate a trajectory of the ball at the outdoor sports venue based on the current data obtained for the at least one weather parameter, where the calculated trajectory of the ball accounts for the impact of the at least one weather parameter. The calculated trajectory of the ball or calculations based on the calculated trajectory of the ball is displayed on a screen.

In accordance with another embodiment, a system is provided. The system includes a data storage that contains wind model data for the outdoor sports venue; at least one processor, a machine-readable medium including instructions stored therein, and a display for outputting in real time the calculated trajectory of the ball or calculations based on the calculated trajectory of the ball. The at least one processor contains a digital model of the outdoor sports venue. When the machine-readable medium is executed by the at least one processor, it causes the at least one processor to perform operations in real-time. The operations include, at a server, obtaining current weather data comprising wind data, where obtaining current weather data comprises receiving the current weather data from a wireless communication network. The wireless communication network collects the real-time data sourced from cellular transmission signals including signal attenuation information. At the server, a trajectory of a ball at the outdoor sports venue is calculated, using the wind model data and the current weather data, taking into account impact of current weather conditions on movement of the ball at the outdoor sports venue based on the obtained current weather data for current weather parameters.

In accordance with yet another embodiment, a system is provided. The system includes a data storage that contains wind model data for the outdoor sports venue, one or more processors, a machine-readable medium including instructions stored therein, and a display for outputting in real time the calculated trajectory of the ball or calculations based on the calculated trajectory of the ball. The one or more processors contains a digital model of the outdoor sports venue. When the machine-readable medium is executed by the one or more processors, the one or more processors performs operations in real-time. The operations include, at a server, obtaining current weather data comprising wind data, where obtaining current weather data comprises receiving the current weather data from at least one wind sensor positioned at or near an outdoor sports venue. If the server stops receiving current weather data from any wind sensor positioned at or near an outdoor sports venue, current weather data is obtained from a wireless communication network. The wireless communication network collects the real-time data sourced from cellular transmission signals including signal attenuation information. At the server, a trajectory of a ball at the outdoor sports venue is calculated, using the wind model data and the current weather data, taking into account impact of current weather conditions on movement of the ball at the outdoor sports venue based on the obtained current weather data for current weather parameters.

BRIEF DESCRIPTION OF THE DRAWINGS

The invention, together with further objects and advantages thereof, may best be understood by reference to the following description taken in conjunction with the accompanying drawings in which:

FIGS. 8-9 are exemplary screenshots of spreadsheet application for determining the impact of weather on a baseball, in accordance with an embodiment.

DETAILED DESCRIPTION OF EMBODIMENTS

The present invention relates generally to a system and method for quantifying the impact of weather on the flight of balls at an outdoor venue. For example, embodiments described herein can be used to predict the flight of a ball at a given location based on weather conditions. Embodiments herein describe a system and method for collecting weather data at a location and using the data to predict the flight of a ball at the location based on weather conditions. The embodiments described herein can model the impact of weather parameters on the flight of a ball for any outdoor sport. It will be noted that the impact of weather on a sporting event can be predicted in advance. In some cases, the predictions can be made as much as four to five days in advance of the event.

Referring to FIGS. 1-4, embodiments of the system will be described. The system collects weather data and can use both historical and current weather data for a given location to determine the impact of the current weather on the flight of a ball in the location. The five most significant weather parameters on the flight of a ball, such as a baseball, are wind (both horizontal and vertical), humidity, temperature, barometric pressure, and precipitation. According to an embodiment, the model for predicting the impact of these weather parameters on the flight of a ball is based on the weighted contribution of each of the parameters is as follows: wind, humidity, temperature, barometric pressure, and precipitation. The relative contribution of these parameters varies based on the given conditions. For example, wind can have zero impact if it is not blowing or it can have nearly 100% of the impact if it is blowing at 50 mph. It will be understood that the five weather parameters do not all need to be factored into the calculations for determining the impact of weather conditions on the flight of a ball. For example, in some embodiments, it may be enough to factor in only wind and humidity. In other embodiments, wind and humidity as well as one or more of the other weather parameters may be considered.

Temperature is positively correlated with the flight of the ball. That is, the warmer the temperature, the farther the ball will fly. Relative humidity, on the other hand, is negatively correlated with the flight of the ball because a moist ball is less elastic than a dry ball and thus will leave the impact point more slowly than a dry ball will for a given impact speed. That is, the lower the relative humidity, the farther the ball will fly. Pressure is also negatively correlated with the flight of the ball. That is, the lower the pressure, the farther the ball will fly.

Figure 1A:
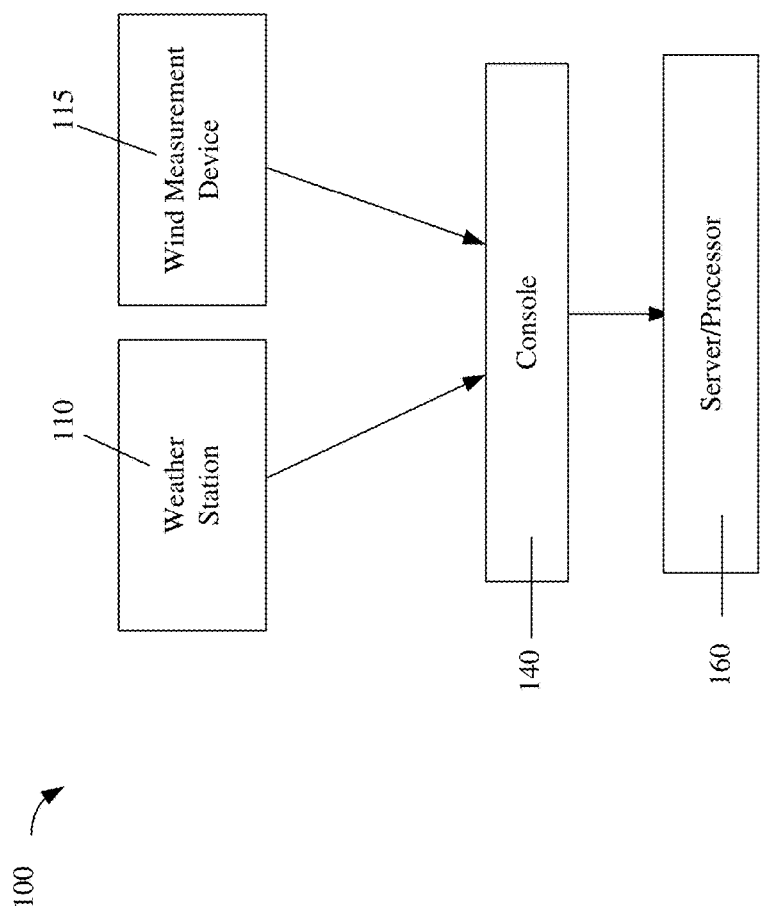
FIG. 1A is a conceptual schematic diagram of a system for predicting the flight of a ball at a location in accordance with an embodiment.
Figure 1B:
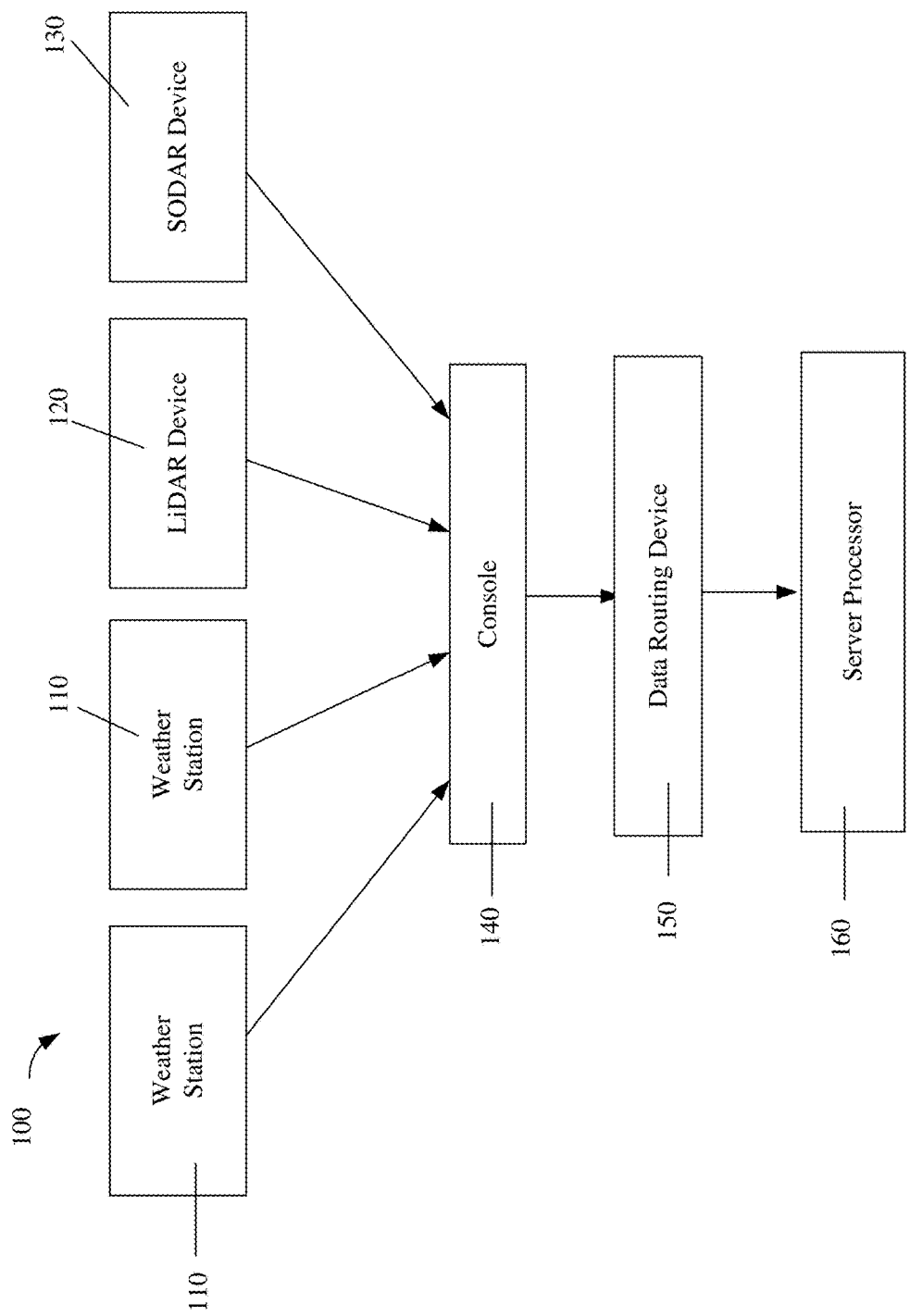
FIG. 1B is a conceptual schematic diagram of a system for predicting the flight of a ball at a location in accordance with another embodiment.

FIGS. 1A and 1B show conceptual schematic designs of embodiments of a system 100 described herein for predicting the flight of a ball based on wind, temperature, relative humidity, precipitation, and air pressure. In the embodiment shown in FIG. 1A, the system 100 includes a weather sensor 110, a wind measurement device 115, a weather console 140, and a server or processor 160. Wind measurement devices 115 include anemometers, LiDAR (Light Detection and Ranging) devices, SODAR (Sonic Detection and Ranging) devices, RADAR devices, and other instruments capable of measuring wind. Unlike anemometers, LiDAR, SODAR, and RADAR devices measure winds remotely. According to an embodiment, at least three wind measurement devices 115 are positioned at or near an outdoor sports venue to measure wind. As will be explained in more detail below, the vertical component of wind can have a significant impact on the flight of a ball.

Another embodiment of the system 100 shown in FIG. 1B includes weather sensors 110, a LiDAR device 120, a SODAR device 130, a weather console 140, a data routing device 150, and a server or processor 160. The data routing device 150 transmits the collected data to the server or processor 160. It will be understood that, in some embodiments, wind measurement instruments, such as anemometers, may be used in place of LiDAR and SODAR devices. In still other embodiments, a LiDAR and/or a SODAR device is used to measure wind. Thus, a system 100 typically includes one or more wind measurement devices 115. In some embodiments, the weather sensor 110 may include a wind measurement device and there is no need for a separate wind measurement device 115.

Figure 2:
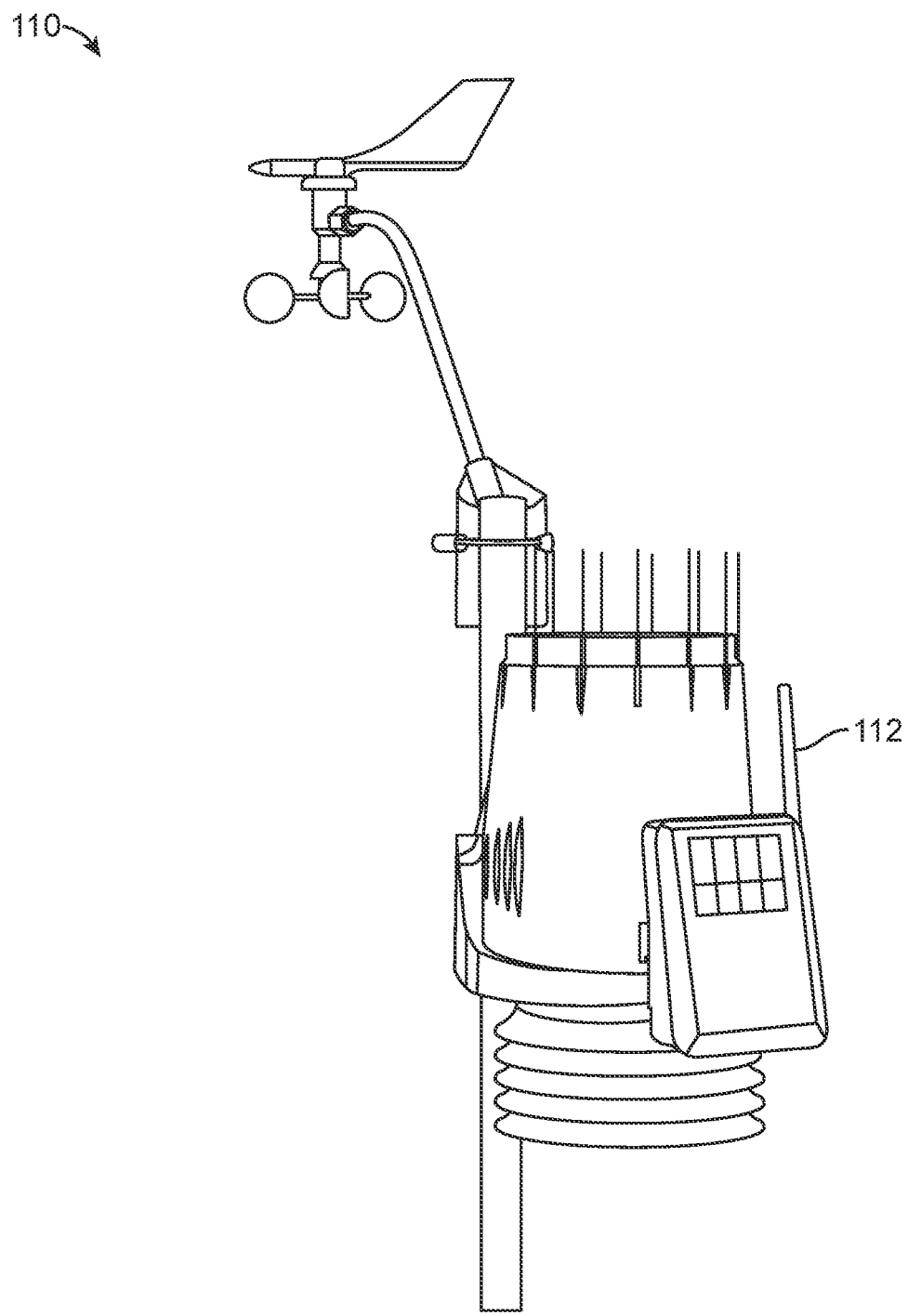
FIG. 2 shows an embodiment of a weather sensor that can be used in the systems shown in FIGS. 1A and 1B.
Figure 4:
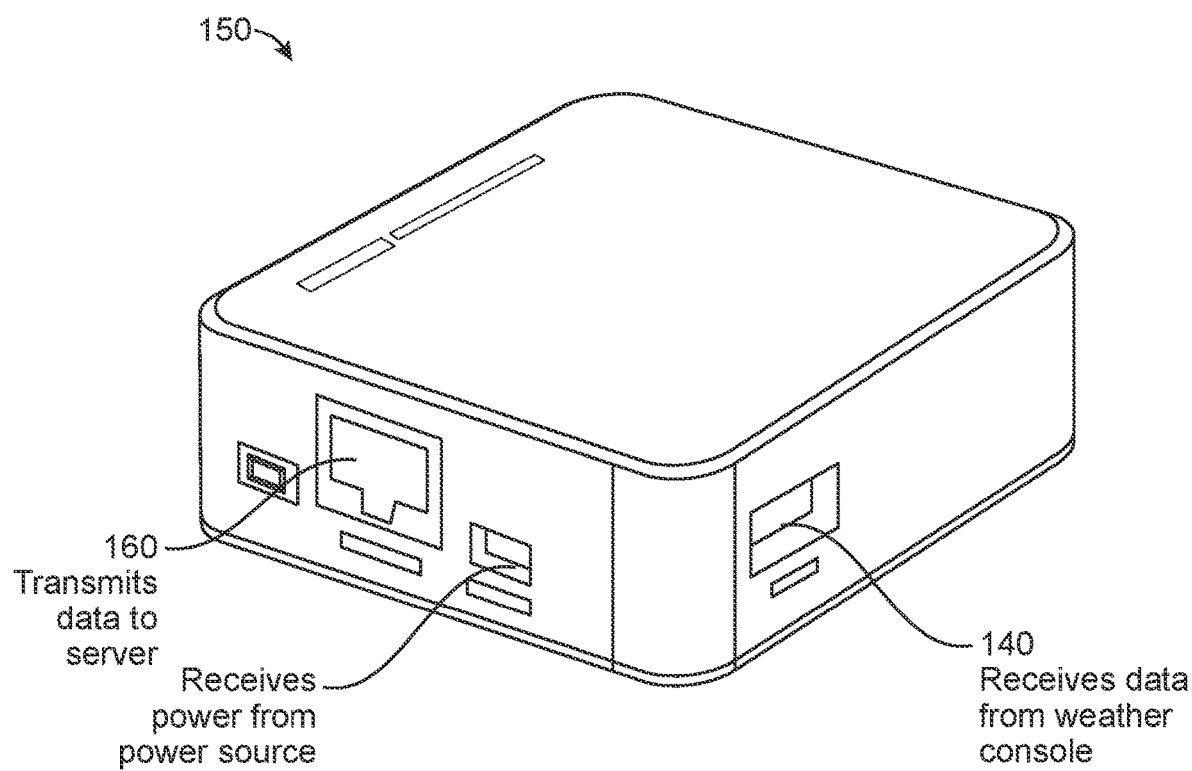
FIG. 4 shows an embodiment of a commercially available Meteobridge device that can be used in the system shown in FIG. 1B.

The weather sensors 110 in the embodiments described herein include sensors, including at least one of the following: thermometers for measuring temperature, humidity sensors for measuring humidity, anemometers for measuring wind speed, barometers for measuring air pressure, and gauges for measuring precipitation. A weather sensor 110 that can be used in the system 100 is shown in FIG. 2. Commercially available weather sensors that can be used in the system 100 include weather sensors from Campbell Scientific, Inc. of Logan, Utah and Davis Instruments Corporation of Hayward, Calif. It will be understood that other weather sensors that include thermometers and humidity sensors can also be used in the system. It will also be understood that, in other embodiments, the system 100 can be any number of thermometers, anemometers, and humidity sensors, barometers for measuring air pressure, and gauges for measuring precipitation as well as any number of LiDAR devices and SODAR devices and any number of data routing devices and weather consoles. It will be noted that a Meteobridge device, which is commercially available, is simply one approach to data transfer using a router connected to a network. FIG. 4 shows an embodiment of a commercially available Meteobridge device that can be used in the system shown in FIG. 1B. Other data transfer systems include cell modems, or radio transfer.

A weather sensor 110 that can be used in the system 100 is shown in FIG. 2. The weather sensor 110 can include a thermometer, humidity sensor, and anemometer. According to another embodiment, a commercially available weather sensor from Campbell Scientific, Inc. includes two to ten pods positioned around the perimeter of a baseball stadium and each of the pods includes an anemometer and a gauge for measuring precipitation. In this embodiment, at least two of the pods also include a thermometer, barometer, and a humidity sensor.

Most of the time, wind has the most significant impact on the flight of a ball. Thus, in most circumstances, it is important to obtain accurate wind measurements. In smaller stadiums that have few obstructions (e.g., minor league baseball stadium or high school baseball field), wind measurements from standard anemometers (as describe above) positioned around the exterior of the field, can adequately represent the horizontal wind over the playing field. However, at larger sports stadiums with significant obstructions, wind flow over the field is much more complex. One example of this complexity is when wind flows over a large wall, the wall causes the flow downwind to become very turbulent. Such a flow is similar to that of a rushing stream as the water flows over a large rock. Thus, using anemometers to simply measure the wind around the exterior of the large stadium (having obstructions) does not provide enough useful information.

On larger sports fields, LiDAR and, to a lesser extent, SODAR devices can be employed to measure the wind over the field. What makes the LiDAR and SODAR devices most useful is that they measure wind remotely. That is, unlike the standard anemometer which measures wind only at its given location, the LiDAR AND SODAR devices measure wind at many distances (both horizontally and vertically) from where the device is located. LiDAR and SODAR devices make it possible to measure the wind over the sports field at several different heights and distances while the game is being played. Another benefit of using LiDAR and SODAR devices is that they can provide direct measurement of vertical wind. And in the cases where it is not possible to obtain this direct measurement of vertical wind, then the vertical wind can be calculated using the horizontal wind measurements that are measured using the LiDAR and SODAR devices. LiDAR devices 120 measure wind using light and SODAR devices measure wind conditions using sound. SODAR systems measure wind by emitting sound waves, primarily vertically. This limits the SODAR system's ability to measure wind over an entire sports field in real time. However, LiDAR systems emit light waves both vertically and horizontally, which allows for better coverage of wind measurements over an entire sports field. According to an embodiment, a LiDAR device 120 is installed in the stadium somewhere off the field where it continually scans the field to get the wind measurements. Instrumentation, including the commercially available Halo Doppler LiDAR, Zephir LiDAR, and/or other LiDAR instruments can be set up around the stadium to collect wind data. In a particular embodiment, the LiDAR device 120 in the system 100 is the commercially available Windcube®100S, manufactured by Leosphere and distributed in North America by NRG Systems. The embodiment described above uses only LiDAR and SODAR devices because at present they are the most cost-effective means of obtaining useful wind measurements. But RADAR devices may also be applicable in the future.

The weather sensors 110, LiDAR devices 120, and SODAR devices 130 can be positioned anywhere in the stadium to collect weather data. According to an embodiment, the weather sensors 110, LiDAR devices 120, and SODAR devices 130 are positioned along roofs of buildings or along the perimeter of a stadium, as these locations are typically unobstructed. In a particular embodiment at a baseball stadium, the weather sensors 110, LiDAR devices 120, and SODAR devices 130 are positioned about 40 feet beyond the center field fence but they can also be positioned behind home plate, or in the stadium along the right or left field line. In some embodiments, the weather measurement devices 110, 120, 130 can be solar powered or battery powered.

Figure 3:
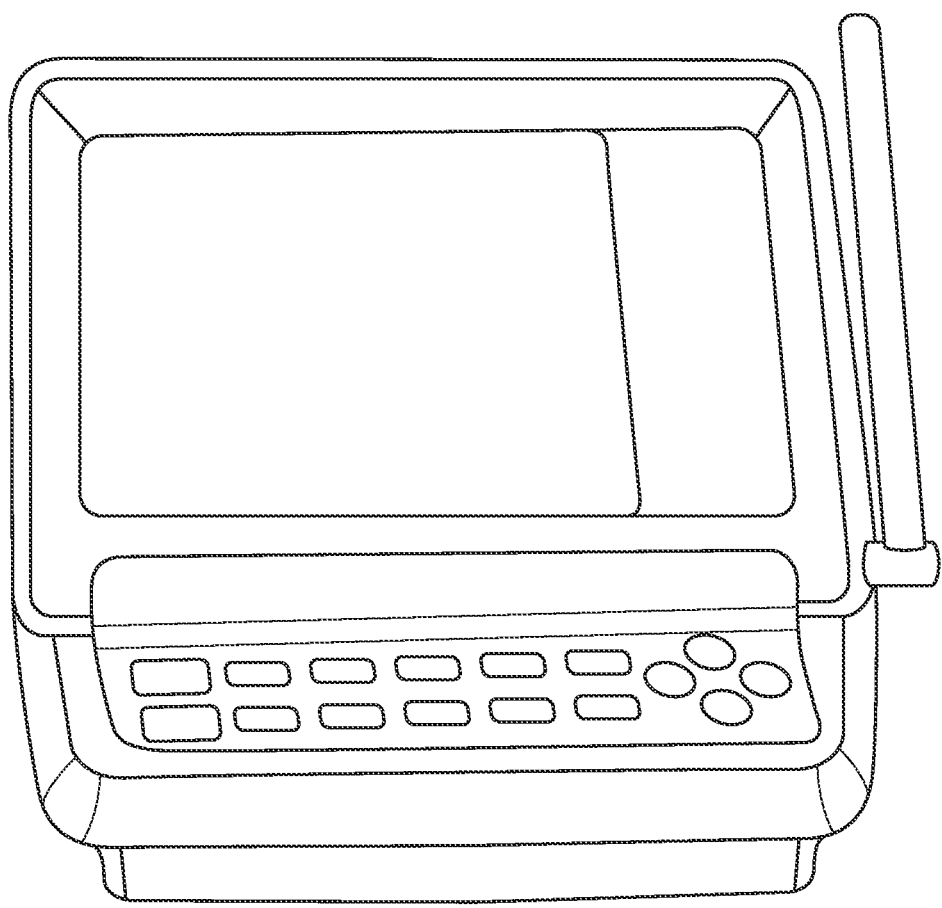
FIG. 3 shows an embodiment of a weather console that can be used in the systems shown in FIGS. 1A and 1B.

The weather data collected by the weather sensors 110, LiDAR devices 120, and SODAR devices 130 are transmitted, preferably wirelessly, to the weather console 140. It will be understood that the transmission of the weather data to the weather console can be either wired or wireless. According to an embodiment, the existing Wi-Fi at the stadium can be used for the wireless transmission. FIG. 3 shows an embodiment of a weather console 140 that can be used in the system 100. Davis Weather Instruments and Campbell Scientific have commercially available weather consoles. As shown in FIG. 2, a radio transmitter 112 is provided on each weather sensor 110 to transmit weather data collected by the sensors to the weather console 140. Radio transmitters can also be provided on the LiDAR devices 120 and SODAR devices 130 to transmit data to the weather console 140.

The weather console 140 then transmits the collected weather data to the data routing device 150. This transmission from the weather console 140 to the data routing device 150 can be either wired or wireless. The data routing device 150 then transmits the collected weather data to a server or processor 160, which then makes calculations, based on a model, to predict the impact of weather conditions on the flight of a ball. Different embodiments of models for predicting the flight of a ball are described in more detail below. The data routing device 150 allows the collected micro climate weather data to be transmitted to the server or processor 160, which can use both historical and current weather data to calculate the impact of weather on the flight of a ball. In other embodiments, other devices, such as a computer, rather than a data routing device can be used to connect the weather console 140 to the server or processor 160. It will be understood that, in some embodiments, the weather sensors 110, LiDAR device 120 and SODAR device 130 transmit the weather data directly to a server or processor 160 without a data routing device.

It will be understood that temperature, relative humidity, and barometric pressure are relatively static compared to wind, so weather sensors for measuring temperature, relative humidity, and barometric pressure can be positioned within and near the sports venue. Alternatively, weather model data for temperature, relative humidity, and barometric pressure obtained from other sources, such as the National Oceanic and Atmospheric Administration (NOAA) and other services, can be used. However, it will be noted that the three-dimensional wind field within the outdoor sports venue that impacts the flight of balls is much more difficult to measure directly with currently available technologies, such as LiDAR, RADAR, SODAR, etc. Therefore, an embodiment using computational fluid dynamics (CFD) described below can be used to determine the three-dimensional wind field within the outdoor sports venue. It will be noted, however, that actual weather sensors are more accurate than weather data obtained from public and commercial sources, especially for wind data. Furthermore, wind measurements using anemometers, LiDAR, RADAR, SONAR, etc. are more accurate than three-dimensional wind fields determined using a CFD model. CFD modeling, however, can be a more economical approach.

According to this embodiment, a Computer Aided Design (CAD) model is generated or otherwise obtained for the outdoor sports venue. According to an embodiment, the CAD model is generated for the outdoor sports venue as well as its surroundings, including a radius that is roughly about 10 times the length or diameter of the venue (depending on the shape of the venue). In other embodiments, the CAD model is generated for the outdoor sports venue and its surroundings, including a radius of about 2-20 times the length or diameter of the venue (depending on the shape of the venue).

As described in more detail below, using the CAD model, CFD modeling is used to produce three-dimensional wind vectors at different grid-points in the digital model of the outdoor sports venue. The CFD model collects historical wind data upstream of the sports venue to produce a set of three-dimensional wind cases, which can then be archived and retained for future use. This historical weather data that is archived can be used in conjunction with real-time or forecast weather data to generate real-time or forecast three-dimensional wind fields in the sports venue. The archived set of historical three-dimensional wind cases should include at least 10 different wind cases for a particular venue on a given day. It will be understood that fewer archived wind cases are needed for venues in locations with fairly consistent winds. If winds are more varied for a location, more archived wind cases are necessary for more accurate calculations of real-time three-dimensional wind fields.

The wind upstream of the outdoor sports venue can then be measured. The most common way to measure the wind is with standard anemometers positioned upstream of the venue. However, wind can also be measured using other technologies, such as LiDAR, RADAR, SODAR, etc. Alternatively, as noted above, other weather model data (e.g., public or commercial sources), can be used instead for estimated real time or forecast winds.

After the upstream wind data is obtained, that upstream wind data is matched or interpolated to the nearest surrounding archived historical CFD cases to determine the three-dimensional wind field in the sports venue in real time (or forecasted).

The real-time three-dimensional wind field (along with temperature, relative humidity, and barometric pressure) is then used to calculate how the weather is either impacting the flight of a specific ball or how the weather will generally impact the flight of an average ball. These calculations are explained in more detail below. Similarly, forecast weather data can be used to determine how the weather will affect the flight of a ball in the future.

Figure 5A:
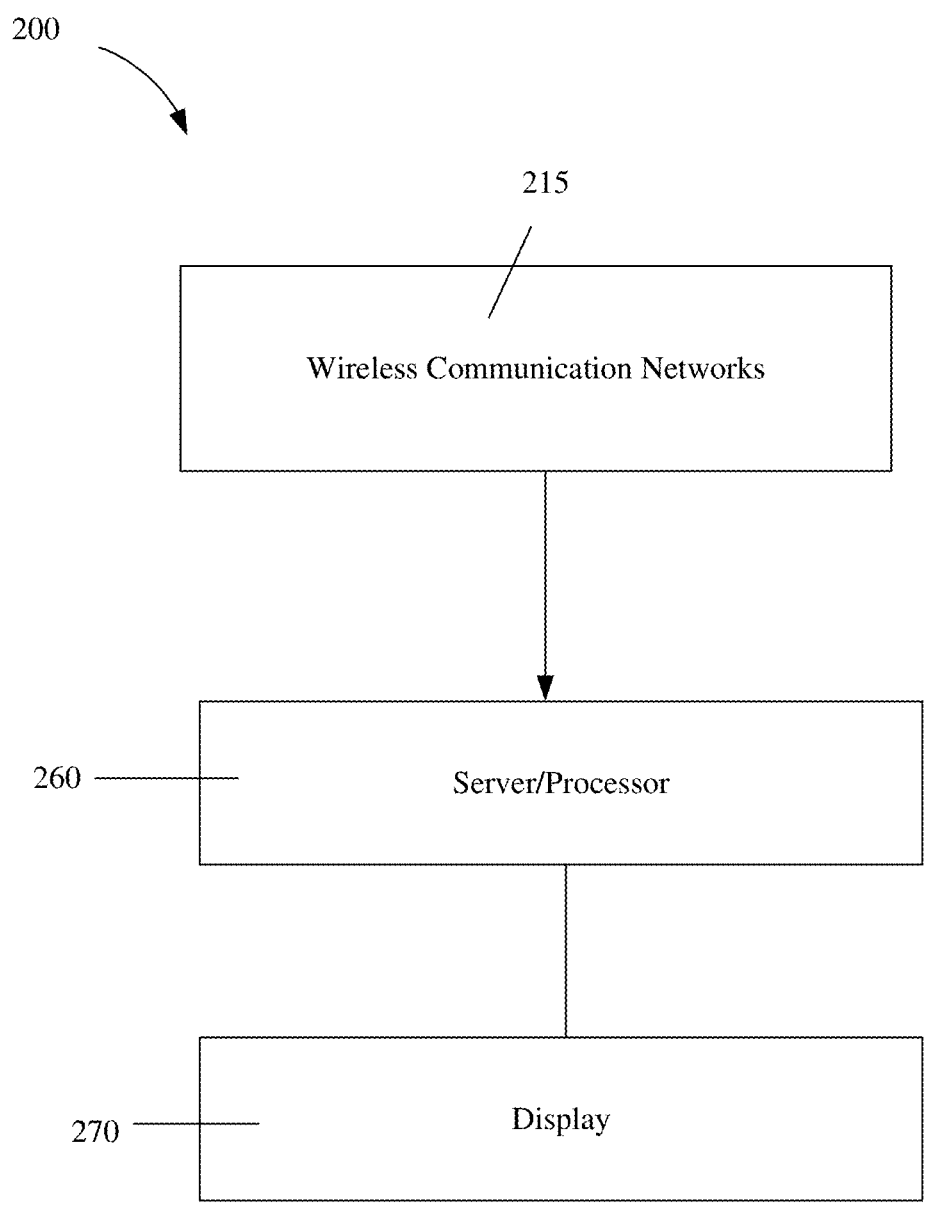
FIGS. 5A and 5B are conceptual schematic diagrams of a system for predicting the flight of a ball at a location in accordance with different embodiments.

According to an alternative embodiment of a system 200, instead of collecting weather data from weather sensors positioned at or near the outdoor sports venue, wireless communication networks 215 are used instead to collect cellular transmission signals to generate real-time weather data. As shown in FIG. 5A, the real-time weather data is transmitted, preferably wirelessly, from wireless communication networks 215 to the server or processor 260. In an embodiment, the real-time weather data from wireless communication networks 215 is obtained from commercial entities, such as ClimaCell, which provides such weather data sourced from wireless communication networks. The weather data is produced by analyzing the quality of cellular transmission signals in the location. The collected weather data can then be used to calculate how the weather is either impacting the flight of a specific ball or how the weather will generally impact the flight of an average ball. As noted above, CFD modeling can be used in such calculations.

According to an embodiment, microwave link data, including signal attenuation information, are acquired from the cellular transmission signals at locations at or near the outdoor sports venue. A microwave link is a wireless signal connection between two separate antennas operating at frequencies above 1.8 GHz.

The microwave link data from different data points are aggregated and then processed, using a data transform, to produce the weather data. The processing includes analyzing the signal quality from various devices, such as cell phones, tablets, laptops, street cameras, connected vehicles, and other Internet of Things devices, to produce the weather data. The analysis is based on the knowledge of how the cellular transmission signal should look (signal quality) without any weather interference, and that different weather phenomena (e.g., precipitation, wind, temperature, etc.) have an effect on the signal. By analyzing the signal quality, the weather phenomena can be determined to produce the weather data. The weather data can be extremely localized (e.g., to the sports venue or even a particular location within the sports venue), as there are many hundreds of millions of data points based on the cellular transmission signals at any given time, and the weather data can be updated frequently—as often as every five minutes, and possibly as often as a few seconds. For example, it is well known that precipitation attenuates microwave signals at frequencies above 5 GHz. Thus, the attenuation of the microwave signals can be analyzed to determine whether the attenuation is caused by precipitation and also determine the intensity of the precipitation. Similar analysis may be performed for other weather phenomena, such as wind, temperature, humidity, etc.

Figure 6A:
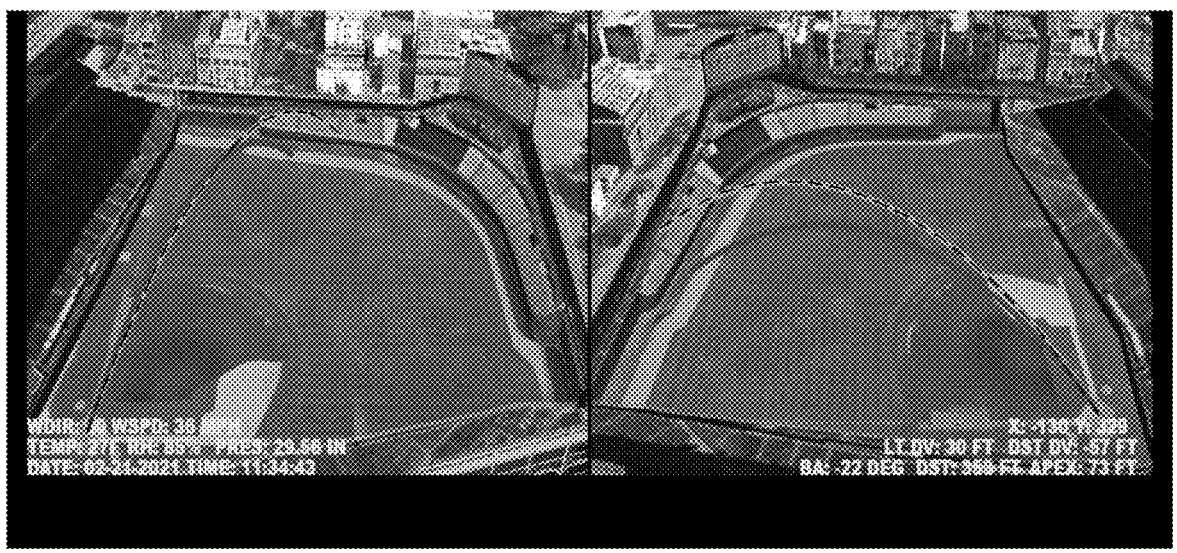
FIGS. 6A and 6B are exemplary outputs on a screen display showing the effect of weather on the trajectory of a ball.
Figure 6B:
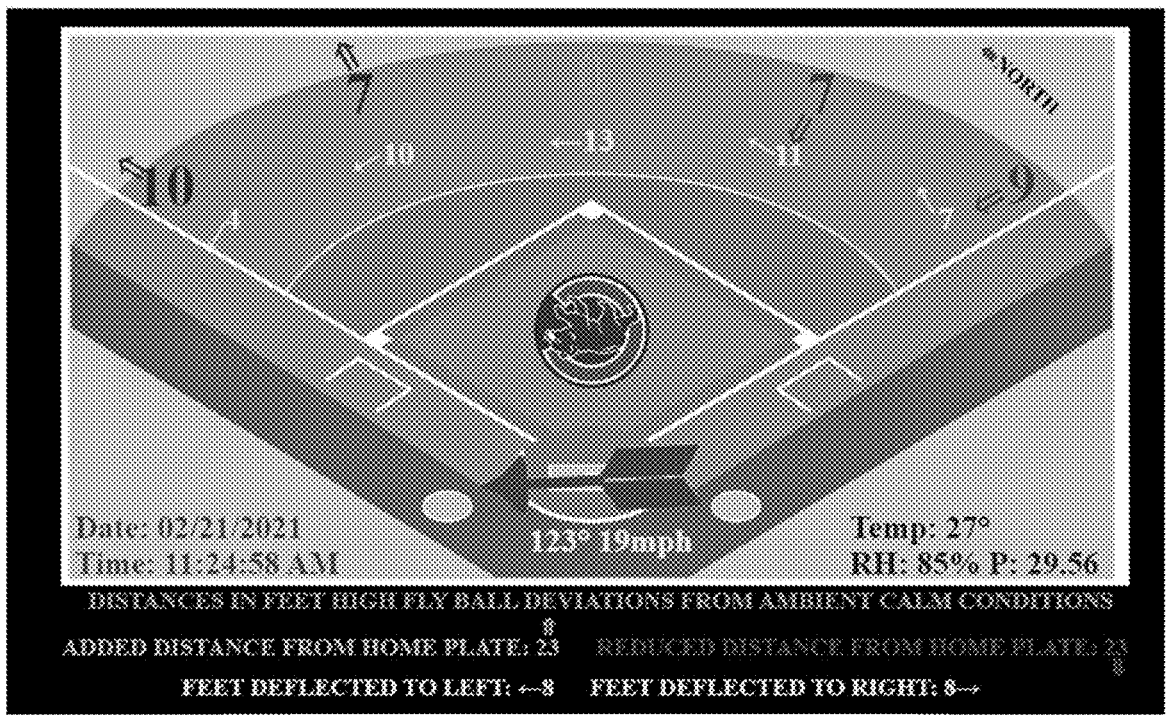

As described in detail below, calculations can be made to determine the trajectory of the ball as affected by the weather. The server 260 can transmit the calculated trajectory of the ball to a display screen 270, as illustrated in the exemplary screenshot display of FIG. 6A. As shown in FIG. 6A, the trajectory of the actual ball flight, as affected by weather, is shown by the solid line and the trajectory of a ball (not affected by wind) is shown by the dashed line. The displayed trajectory can be an animation of the trajectory. FIG. 6B is an example of another display in which the effect of the current or forecast wind will have on a baseball that is hit from home plate. The arrows in FIG. 6B show the wind direction and the direction in which the wind is pushing or will push a ball. This display shows how much the flight of the ball is shortened or lengthened by the wind and how much the ball is pushed to the left or right by the wind. The numbers next to the arrows are the calculated magnitude of deviations based on the effect of the wind on the baseball. The wind direction and magnitude of deviations can be updated and displayed frequently, as often as every few seconds.

Figure 5B:
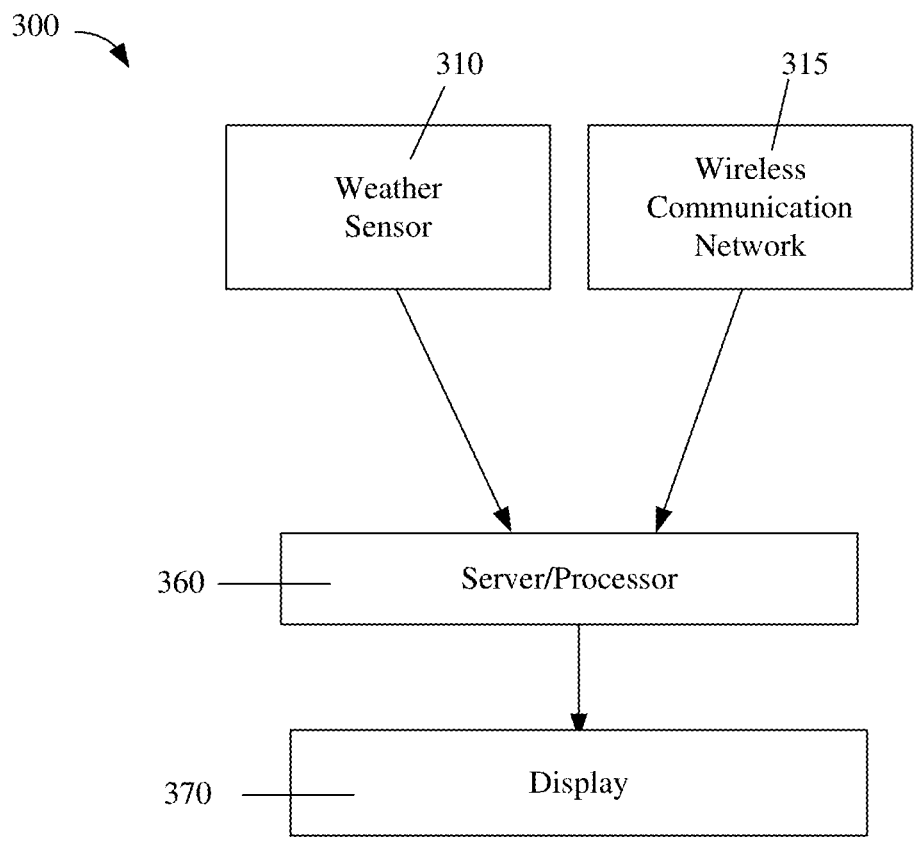

Alternatively, the weather data can be obtained from public sources, such as NOAA, Weather Underground, and Davis Instruments, which have their own weather sensors for collecting weather data. In some embodiments, a combination of weather data measured by weather sensors and weather data collected from wireless communication networks is used. According to an embodiment of the system 300 shown in FIG. 5B, weather data is collected from both weather sensors 310 and from wireless communication networks 315. In this embodiment of the system 300, the weather data collected from weather sensors 315 can be collected from sensors operated by NOAA, Weather Underground, etc. or from a weather sensor, such as a weather sensor 110, LiDAR devices 120, and SODAR devices 130, that is at or near an outdoor sports venue, such as a stadium, golf course, or another type of sports field. In this embodiment, the weather data from weather sensors and from wireless communication networks are transmitted, preferably wirelessly, to the server or processor 360. According to an embodiment, weather data from all of the sources can be used by the server or processor 360 to calculate the effect of the weather parameters on the flight of a ball, as will be described in more detail below.

As described in detail below, calculations can be made to determine the trajectory of the ball as affected by the weather. The server 360 can transmit the calculated trajectory of the ball to a display screen 370, as illustrated in the exemplary screenshot display of FIG. 6A. The displayed trajectory can be an animation of the trajectory. As shown in FIG. 6A, the trajectory of the actual ball flight, as affected by weather, is shown by the solid line and the trajectory of a ball (not affected by wind) is shown by the dashed line. FIG. 6B is an example of another display in which the effect of the current or forecast wind will have on a baseball that is hit from home plate. The arrows in FIG. 6B show the wind direction and the direction in which the wind is pushing or will push a ball. This display shows how much the flight of the ball is shortened or lengthened by the wind and how much the ball is pushed to the left or right by the wind. The numbers next to the arrows are the calculated magnitude of deviations based on the effect of the wind on the baseball. The wind direction and magnitude of deviations can be updated and displayed frequently, as often as every few seconds.

According to another embodiment, weather data from weather measurement devices 110, 120, 130 positioned at or near the sports venue are used by the server or processor calculate the trajectory of a ball as impacted by weather, and the weather data sourced from wireless communication networks are used as backup weather data in the event the weather measurement devices 110, 120, 130 malfunction or are otherwise inoperable. Thus, if the server or processor determines that it is no longer receiving weather data from the weather measurement devices 110, 120, 130, the server or processor will begin receiving weather data from wireless communication networks. Similarly, in another embodiment, the weather data obtained from weather measurement devices 110, 120, 130 positioned at or near the sports venue are used as backup weather data in the event weather data sourced from wireless communication networks are unavailable. Thus, if the server or processor determines that it is no longer receiving weather data from wireless communication networks, the server or processor will begin receiving weather data from the weather measurement devices 110, 120, 130.

According to embodiments, the system 100, 200, 300 uses wind, temperature, relative humidity, air pressure, and precipitation to calculate how many feet are being added to or subtracted from the flight of an average ball hit to the average distance to the outfield fence of a baseball stadium. These weather factors can also be used to calculate how many feet are being added to or subtracted from the flight of a ball thrown to home plate from an outfielder as well as balls thrown by a pitcher. These weather factors can also be used to calculate how much slower or faster a ball thrown in from the outfield to home plate will travel. It will be understood that, while a large portion of the description herein is applied to baseball, the models described herein can be applied to other sports, including football, golf, cricket, tennis, soccer, archery, rowing, bike racing, car racing, etc.

According to an embodiment, a model for predicting the flight of a ball at a given stadium is created by first analyzing long-term weather data sets, such as those collected by nearby weather sensors 110, LiDAR devices 120, and SODAR devices 130 or weather data sets specific to the site sourced from wireless communication networks. From the historical weather data collected at the site, an "average day" is established. That is, when each weather parameter (excluding wind and precipitation) is at its long-term average for the start of the baseball game, then the sum of the parameters' influence on the ball must equal zero. The impact of wind on the ball can only be zero when there is no wind at all. Otherwise, the wind's influence on the ball is either positive or negative, left or right, and up or down. The influence of precipitation on the flight of the ball is only negative, as the heavier the precipitation, the more negative the impact on the flight of the ball. The model works by taking each parameter (except for wind and precipitation) and adding to (or subtracting from) the average day when the weather parameter enhances (or reduces) the flight of the ball. It will be understood that no two baseball stadiums (or any other type of stadiums) will have the exact same model, although they will generally be similar.

As noted above, there are five weather parameters that have an impact on the flight of a ball: temperature, relative humidity, barometric pressure, precipitation, and wind. The model used in a particular embodiment described herein is based the sport of baseball and on the flight of a baseball that travels a distance of 375 feet, which is the average distance of the outfield wall from home plate. It will be understood that since the average distance to the outfield wall is different for each stadium, this number will vary for each stadium. The influences of the different weather parameters are calculated to predict the flight of a ball, based on models that will be explained in greater detail below.

A brief summary of the weather influences on the flight of a baseball (or any type of ball) under most conditions is roughly as follows. Temperature increases the distance of the flight of a ball by approximately three feet for every 10 degree increase in temperature on the Fahrenheit scale. Humidity decreases this distance by approximately six feet for every 10% increase in humidity. Pressure increases this distance by approximately seven feet for every inch decrease in mercury. The wind influence on the distance of the flight of a ball is much more complex. Headwinds hamper the flight of a ball more than the addition to the flight of a ball from equal tailwinds. Downward wind has an adverse impact on the flight of a ball, while upward wind enhances the flight of a ball. The influence of the weather parameters on the flight of a ball are discussed in more detail below.

An example will be described below to illustrate the calculations performed by the system 100. Average values (except wind and precipitation) for each parameter are used as the basis for the calculations. It will be understood that these average values are exemplary and are based on a particular location. For illustration purposes, in a particular example, the following are assumed: the average temperature is 81° F., the average humidity is 59%, and the average pressure is 29.92 inches of mercury. The server or processor 160 calculates an index value of how many feet are being added to left field, center field, and right field. Data are collected at the field and transmitted to the server. The software screens the data for accuracy, and then the data is fed into the model, which calculates how many feet the weather is adding to or subtracting from the average fly ball hit 375 feet. The calculations in this embodiment are based around the flight of an idealized or average ball hit to the warning track, which is assumed to be about 375 feet from home plate. In other embodiments, where actual flight data is available, specific impacts of weather on that given ball can be calculated. In accordance with an embodiment, the calculations are displayed on a screen. According to an embodiment, the calculations are uploaded to a website and can be frequently updated (e.g., every 2-3 seconds).

It will be understood that, as the different weather parameters are measured in different units, each parameter must be multiplied by a particular predetermined coefficient in order to scale each parameter so that it has the appropriate contribution to the flight of the ball. What are illustrated here are averaged simplified estimates of the influences of each weather parameter. As will be explained in more detail below, there are 90 different configurations for coefficients in a particular embodiment. That is because there are a number of calculations published in the scientific literature for drag coefficient, lift coefficient, and spin rate decay. In the model used for calculations in this embodiment, the coefficient of each of the parameters is provided below:

Temperature Coefficient=−0.3
Humidity Coefficient=0.6
Pressure=7
Wind=Varies based on the speed and direction of the wind and the spin of the ball
Precipitation=Varies based on how hard the precipitation is falling Temperature is positively correlated with the flight of the ball. That is, the warmer the temperature, the farther the ball will fly. This correlation is represented mathematically by Equation (1) to determine the contribution of the temperature to the impact caused by weather on the flight of the ball:

$$\text{Temp.}=\text{Temp.Coefficient}*(\text{Average Temp.}-\text{Actual Temp}) \quad (1)$$

Relative humidity, on the other hand, is negatively correlated with the flight of the ball because a moist ball is less elastic than a dry ball and thus will leave the impact point more slowly than a dry ball will for a given impact speed. That is, the lower the relative humidity, the farther the ball will fly. This correlation is represented by the following equation to determine the contribution of the humidity to the impact caused by weather on the flight of the ball:

$$\text{Humidity}=\text{Humidity Coefficient of 0.6}*(\text{Average Humidity}-\text{Actual Humidity}) \quad (2)$$

Pressure is also negatively correlated with the flight of the ball. That is, the lower the pressure, the farther the ball will fly. This correlation is represented by Equation (3) to determine the contribution of the air pressure to the impact caused by weather on the flight of the ball:

$$\text{Pressure}=\text{Pressure Coefficient}*(\text{Average Pressure}-\text{Actual Pressure}) \quad (3)$$

Horizontal wind is treated as forward and backward. Forward wind is a tailwind, which increases the flight of the ball. Backward wind is a headwind, which decreases the flight of the ball. Any wind that is not directly forward or backward is broken down into its component parts so that a forward or backward wind can be used. For vertical wind, up is positive and down is negative. In some embodiments, vertical wind is assumed to be zero. Typically, vertical wind will not be assumed to be zero for larger stadiums.

A home run takes an average of 4-4.5 seconds from the time the ball is hit until the time the ball lands. The average home run ball reaches a maximum height of about 80 feet in elevation. The average home run ball spends about 3 seconds above 50 feet and below 100 feet in elevation. Thus, the wind that will have the biggest influence on the flight of the ball is between 50 and 100 feet in elevation.

It is clear that the wind's influence on the ball is not constant over its trajectory. In an embodiment, average wind speed from 50 to 100 feet in elevation is used in the model. In a larger stadium system, where LiDAR (or SODAR) can be used, the actual measured wind speed (not an average wind speed) is used in the model. Wind is represented mathematically as set forth below.

Horizontal wind is measured and then broken down into its component parts on an X-Y axis, where the X-axis runs from home plate in the direction that the ball initially leaves the bat, and the Y-axis runs to the left of that direction. Thus a ball hit initially toward $2^{nd}$ base will have the X axis increasing toward centerfield and the Y axis increasing toward $3^{rd}$ base along a line running from $1^{st}$ base to $3^{rd}$ base.

The X-component of the wind is calculated using Equation (4):

$$X\text{-component of Wind}=\text{Speed of Wind}*\text{Cosine}(\text{Ball Park Orientation}+\text{Ball Angle}-\text{Wind Direction}) \quad (4)$$

where Ball Park Orientation is the direction in degrees (where 360 degrees is north and 180 degrees is south) of the line that runs from home plate to straight-away center field and Ball Angle is 0 degrees for a ball initially hit towards center field and +/−45 degrees for a ball initially hit toward right/left field. For a Ball Park Orientation of 360 degrees, home plate would be north of straight-away center field. The Y-component of the wind is calculated using Equation (5):

$$Y\text{-component of Wind}=\text{Speed of Wind}*\text{Cosine}(\text{Ball Park Orientation}+\text{Ball Angle}+90-\text{Wind Direction}) \quad (5)$$

A headwind shortens the flight of a ball more than a tailwind lengthens the flight of the ball. The influences of wind on the flight of a ball are non-linear and include drag, lift, and gravity forces.

Precipitation only detracts from the flight of a baseball. When the ball becomes wet, it becomes heavier, which causes the ball to travel a shorter distance than it would have if it were dry. Additionally, a wet ball is more "spongey," which causes the ball to leave the bat with a lower initial velocity than it would have if the ball were dry. The impact of precipitation is calculated using Table 1 below. It will be understood that Table 1 is merely an example of quantification of the impact of precipitation.

TABLE 1

| Rain Amount | 0.151 | 0.091 | 0.041 | 0.021 | 0.011 | 0.001 | 0.000 |
|---|---|---|---|---|---|---|---|
| 5 Mins Ago | −100 | −100 | −90 | −60 | −45 | −35 | 0 |
| 10 Mins Ago | −70 | −40 | −25 | −15 | −10 | −6 | 0 |
| 15 Mins Ago | −36 | −17 | −10 | −7 | −5 | 0 | 0 |
| 20 Mins Ago | −32 | −14 | −7 | 0 | 0 | 0 | 0 |
| 25 Mins Ago | −28 | −11 | 0 | 0 | 0 | 0 | 0 |
| 30 Mins Ago | −24 | −8 | 0 | 0 | 0 | 0 | 0 |
| 35 Mins Ago | −20 | −5 | 0 | 0 | 0 | 0 | 0 |
| 40 Mins Ago | −16 | −2 | 0 | 0 | 0 | 0 | 0 |
| 45 Mins Ago | −12 | 0 | 0 | 0 | 0 | 0 | 0 |
| 50 Mins Ago | −8 | 0 | 0 | 0 | 0 | 0 | 0 |
| 55 Mins Ago | −4 | 0 | 0 | 0 | 0 | 0 | 0 |
| 60 Mins Ago | 0 | 0 | 0 | 0 | 0 | 0 | 0 |

The contribution of each parameter (e.g., temperature, humidity, pressure, wind, and precipitation) is calculated and then summed together to obtain the net impact on the flight of the ball.

Figure 8:
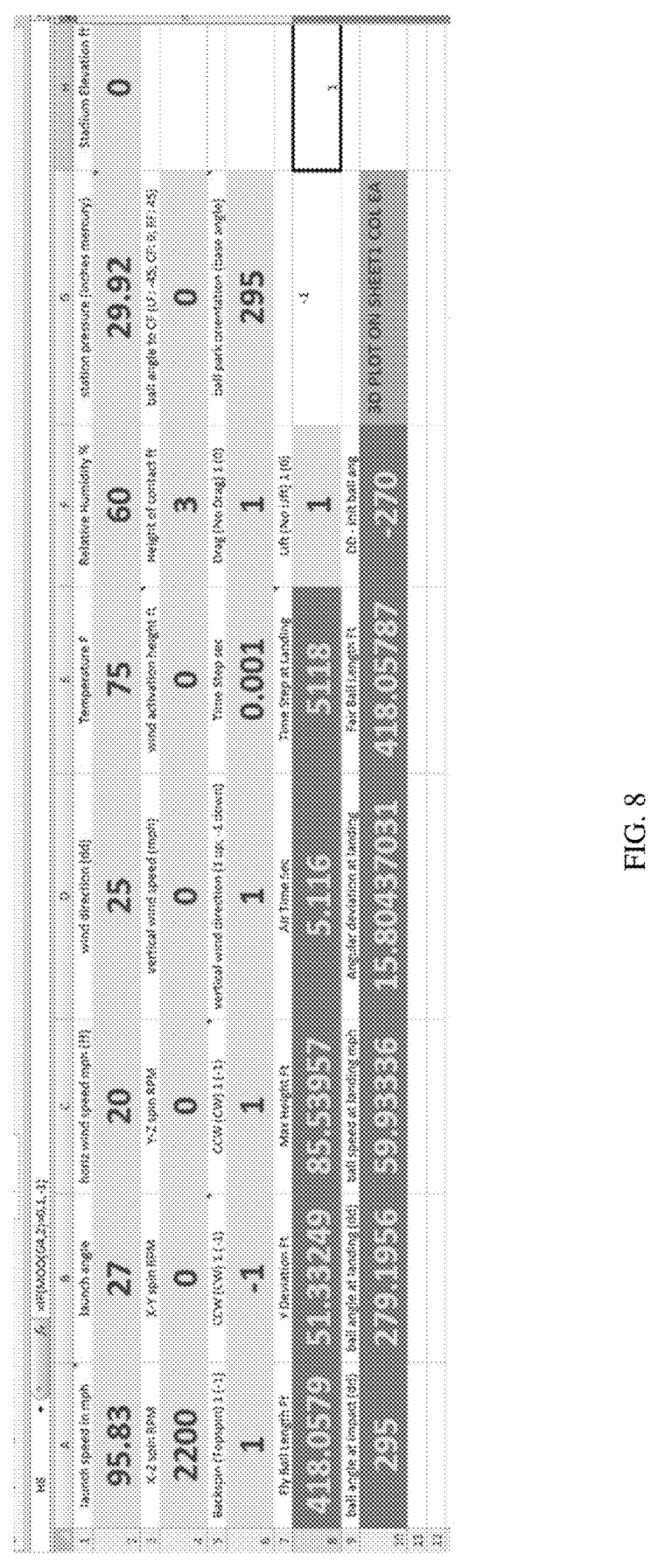
Figure 9:
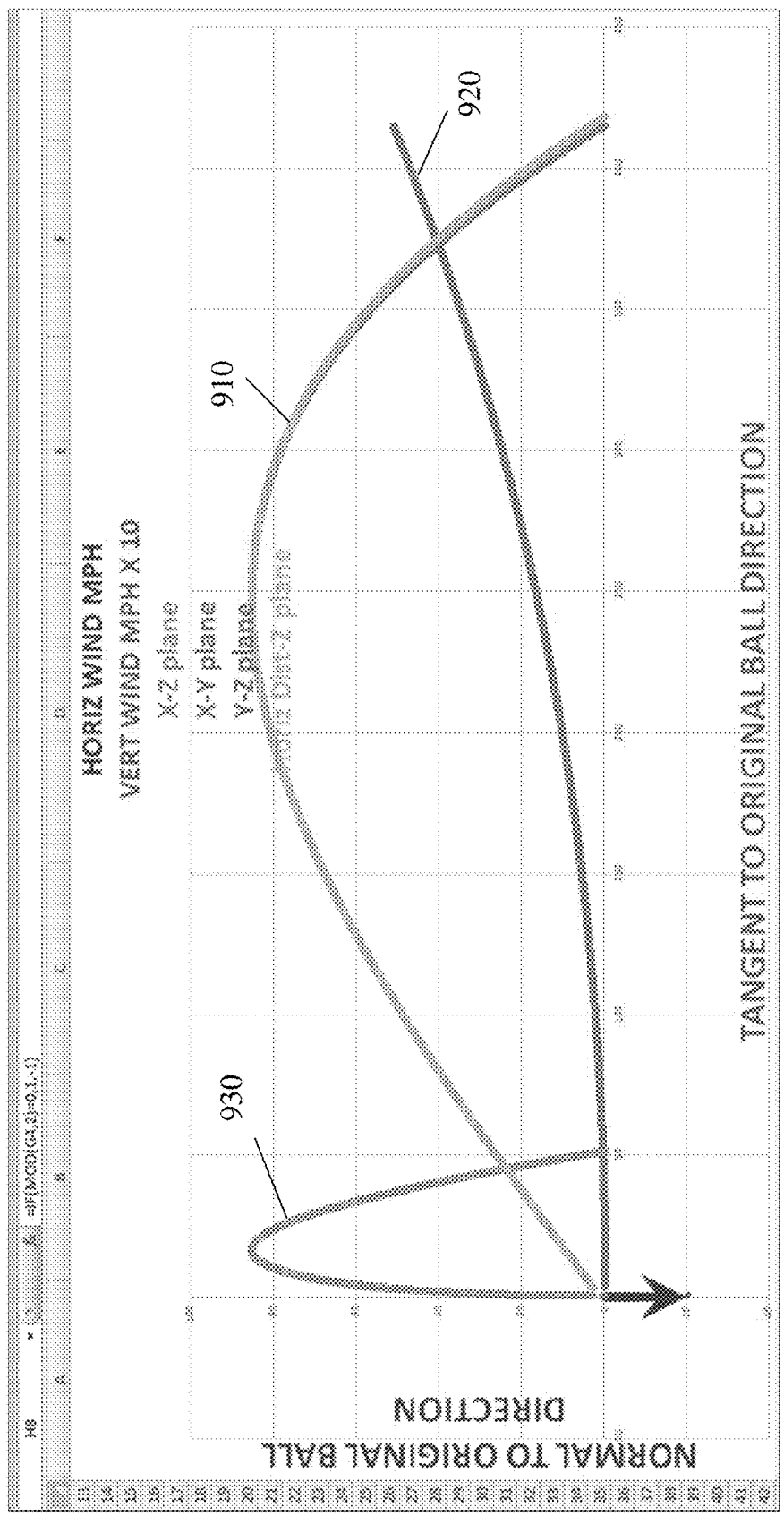

In a particular embodiment, the model that is used to predict the impact of weather parameters on the flight of a ball resides on an application, such as, for example, a spreadsheet that can receive various inputs and calculate the flight of the ball based on the weather conditions. Various pages of the spreadsheet of this embodiment are shown in FIGS. 8-9. The model illustrated in FIGS. 8-9 is used for baseball. However, it will be understood that the model can be modified to determine the influence of weather on the flight of a ball in other sports, including football, golf, cricket, and volleyball.

As the specific model illustrated in FIGS. 8 and 9 is based on baseball, the forces that affect the flight of a baseball will be discussed below. There are three vectors (forces) that act on a baseball while it is in flight. These vectors are gravity, drag, and the lift or magnus force. At each instantaneous moment the ball's velocity is traveling in a specific direction, and the angle between this direction and the ground is the ball's current angle of orientation. The drag force always acts in the opposite direction of the velocity vector. The lift or magnus force acts perpendicularly to the spin axis of the ball, and generally points away from the ground (assuming the ball is hit with backspin). Gravity always pulls the ball directly from its center of mass straight to the ground, so the direction of the force of gravity is independent of the ball's orientation.

Gravity is the natural force that pulls all objects (including the ball) towards the earth. The force of gravity is fairly simple, and is easily determined by multiplying the constant acceleration of gravity g by the mass of the ball M. Thus, the force of gravity on the baseball is M*g.

Calculating the drag force is much more complex. Drag force is the force of air resistance that slows the ball down. Physically put, the drag force is equal to 0.5 multiplied by the air density (rho), multiplied by the cross-sectional area of the ball and the drag coefficient, and then finally multiplied by the ball's air speed squared. Thus, the drag force=$0.5*rho*A*Cd*V_a^2$. Rho or air density is a measure of how tightly air is packed. A rise in temperature, or a lowering of pressure, results in a lower air density. There are three different options for calculating air density and the most common is the following equation: rho=P/(RdT).

According to this embodiment, initial parameters for the flight of the ball, such as the ball's launch speed, launch angle, spin rate (in all directions), and spin rate decay, are input using a spreadsheet, such as the one shown in FIG. 8. As shown in FIG. 8, these initial parameters are entered into the spreadsheet in appropriate places, either manually by a user or received from a source. Each initial parameter will be discussed below.

Launch speed (mph), launch angle (degrees), and spin rate (rpm) are routinely measured by all major league baseball teams for all of their teams (both minor and major league). According to an embodiment being used in real time, an average of each of launch speed, launch angle and spin rate is received by the application (spreadsheet) as inputs. The weather parameters (horizontal wind speed, wind direction, temperature, relative humidity, station pressure, and precipitation are measured with weather instruments, such as those described above. The inputs of the weather parameters can be received by the server or other processor from the weather instruments via wireless transmission, as described above. In some embodiments, the stadium elevation is also entered, as it is sometimes important for including in the adjustment calculation of station pressure.

X-Z spin is the spin of the ball about the Y axis. This is spin that would rotate counterclockwise or clockwise from a right field view perspective of the ball flight, where the Z direction runs from the ground vertically straight up in the air, and the X direction runs from home plate in the initial horizontal direction that the ball leaves the bat. Thus, the Y-axis runs in the horizontal plane perpendicular and to the left of the X direction as viewed from home plate. This spin results in an up or down motion, which would cause a change in the lift coefficient, and therefore used in some of the embodiments of the model described herein. The X-Z spin is typically tracked by Doppler radar and these statistics are provided by major league baseball teams.

X-Y spin is the component of spin of the ball about the Z axis. This is spin that would rotate counterclockwise or clockwise from a bird's eye view perspective of the ball flight, where the X and Y directions are as defined above. Normally, a baseball hit to center field has very little spin along this axis, while a baseball hit to left field would have positive (counterclockwise) spin and a baseball hit to right field would have negative (clockwise) spin, but any spin would cause a change in the lift coefficient.

Y-Z spin is the spin of the ball about the X axis. This is spin that would rotate counterclockwise or clockwise from a center field view perspective of the ball flight, where the X, Y, and Z directions are as defined above. This spin results in side to side motion as well as up and down motion, and can be calculated given the angle spin which is readily available from the teams' databases. However, it will be noted that the Y-Z spin is normally negligible.

According to some embodiments, vertical wind speed is assumed to be zero, but actual vertical wind speed can be measured or calculated with LiDAR or SODAR measurements in larger stadiums. Wind Activation Height is the height at which the wind is assumed to start acting on the ball. That is, there is zero wind at the surface and it generally increases with increasing height. In order to calculate the impact of the wind on the ball, wind is assumed to be about one half the actual wind speed below the Wind Activation Height. In the illustrated embodiment, the wind Activation Height is assumed to be ground level, as shown in FIG. 8.

Height of Contact is the height above the ground that the ball is hit. For baseball, this is most often assumed to be an average of 3 feet above the ground. Ball Angle to CF is the angle of the ball hit in relationship to center field, and can also be tracked by Doppler RADAR. Thus, if a ball is hit directly to center field, this value will be zero. If a ball is hit to left of direct center, this value will be between −45 and zero. If a ball is hit to right of direct center, this value will be between zero and +45.

Backspin (Topspin) is simply counter-clockwise X-Z spin (see above), where 1 is backspin and −1 is topspin. This is used in calculating the upward or downward movement of the ball, as a ball with backspin is ascending and a ball with topspin is descending. This is used to calculate the direction and magnitude of spin in each direction, which impacts the lift coefficient (to be explained later).

In this embodiment, CCW (CW) is simply counter-clockwise X-Y spin (see above), where 1 is a ball spinning counter-clockwise (clockwise) as viewed from above. This would cause the ball to track to the left (right). This is used to calculate the direction and magnitude of spin in each direction, which impacts the lift coefficient (explained in further detail below).

According to this embodiment, CCW (CW) is simply counter-clockwise Y-Z spin (see above), where 1 is a ball spinning counter-clockwise (clockwise) as viewed from home plate. This would cause the ball to track to the left (right). This is used to calculate the direction and magnitude of spin in each direction, which impacts the lift coefficient (explained in further detail below). In this embodiment, for Vertical Wind Direction, 1 means upward wind and −1 means downward wind.

Time step is the time interval in seconds that the ball is tracked through its flight. So a value of 0.001 has the ball being tracked every one thousandth of a second. This can be changed to accommodate any desired interval. It will be noted that the direction in which the ball is hit and the spin characteristics of the ball are tracked, using a device, such as Doppler RADAR.

In this embodiment, Drag (No Drag) is simply a switch to turn on or off the Drag coefficient. This is useful for doing theoretical calculations in a vacuum, when the Drag is set to zero. Drag coefficient will be discussed in more detail below, but a quick summary is that it is the friction applied by the air against the ball as it travels. There are eight different values referenced in the scientific literature for drag coefficient. Each of these has mathematical justification. As it is not clear which of these is the most accurate, the user can either select from one of the eight possibilities or take an average of the eight.

Ball park orientation is the angle (stated in 1 to 360 degrees) where straight-away center is pointing based on a line that extends from home plate, over second base, to straight-away center field.

Lift (no Lift) is a switch to turn on lift coefficient, where 1 is on and 0 if off. This is useful for theoretical calculations where the ball has no lift. Lift coefficient is related to the Bernoulli equation and it essentially is how the backspin of the ball helps it rise as it travels. There are five different values referenced in the scientific literature for lift coefficient. Each of these has mathematical justification. As it is not clear which of these is the most accurate, the user can either select from one of the five possibilities or take an average of the five.

After all of the above inputs are entered, then the flight of the ball is calculated and important variables are output and displayed on a screen, as shown in FIG. 8. The displayed variables can include the calculated fly ball length, maximum height of the ball, ball angle at landing, ball speed at landing, etc.

After the calculations are performed, a visual graph of the ball flight can be displayed on a screen, as shown in FIG. 9. In FIG. 9, Line 910 shows the view looking in from right field. Line 920 shows the view from above where the ball originates at home plate (left) and ends in the outfield (right). Line 930 represents the view of the ball from straight-away center field, based on the inputs received, as shown in FIG. 8.

It will be understood that the embodiment described above with reference to FIGS. 8-9 applies to baseball. It will be understood that this method can be tailored to different types of balls (based on the size, mass, cross-section, material (drag coefficient), etc. of the ball) used in different sports. Thus, the following constants are used in the calculations set forth below in order to provide the calculations and visual graph displayed, as shown in FIG. 9:

Mass of baseball (m)=0.145 kilograms
Radius of baseball (r)=36.4 mm
Cross sectional area of baseball (A)=$\pi \ast (r^2)$ m$^2$
Air Constant (Rd)=287 J/kg/K
Gravity (G)=9.8 m/s$^2$ As explained in more detail below, the current X component of distance a ball has traveled from its starting point (origin) of the trajectory can be determined by calculating, at each time step, the positional change in each component direction (x, y, and z) using the previous position and velocity component to determine the current component position and current component acceleration. The current acceleration component is then used to determine the current velocity component. These calculations are repeated for each subsequent time step until the ball either hits the ground or would have hit the ground.

To determine the current X component of distance a ball has traveled from the origin (initial position of the trajectory) based on the given weather parameters, Equation (6) is used:

$$X = x_o + \sum_{t=0}^{t(z)=0} \Delta x \qquad (6)$$

where $x_0$ is the ball's initial X component at the starting point at time t=0 (where the ball is launched), $\Delta x = u_{i-1} \ast \Delta t$ and u=x velocity, i=time step, and $\Delta t$=change in time ($t_i - t_{i-1}$) Likewise, v=y velocity and w=z velocity of the ball.

It will be understood that the subscript "i" refers to the ith timestep, where i starts at zero when the ball is hit and continues for as many timesteps until z=0, i.e., the ball is either on the ground or would have reached the ground at the same level as home plate, where:

$u_i = u_{i-1} + \Delta u_i$ $\Delta u_i = ((x\text{drag}_i + x\text{lift}_i)/\text{mass of baseball}) \ast \Delta t$ $x\text{drag}_i = -\text{abs}(ua_{i-1} \ast FFF_{a-1}) \ast \text{sign}(ua_{i-1}) \ast rho \ast A \ast Cd \ast 0.5$ $y\text{drag}_i = -\text{abs}(va_{i-1} \ast FFFa_{i-1}) \ast \text{sign}(va_{i-1}) \ast rho \ast A \ast Cd \ast 0.5$ $z\text{drag}_i = -\text{abs}(wa_{i-1} \ast FFFa_{i-1}) \ast \text{sign}(wa_{i-1}) \ast rho \ast A \ast Cd \ast 0.5$ where abs( ) is absolute value and $FFFa_i$ is the total 3 dimensional airspeed and
sign(variable)=1 for variable >0; −1 for variable <0; and 0 for variable=0.
rho=air density=$1.2929 \ast (273/(T+273)) \ast (P \ast e^{(-0.0001217 \ast El)} - 0.3738 \ast Rh \ast SVP/100)/760)$
$ua_i$=air speed velocity in x ($u_i - uair_i$)
$va_i$=air speed velocity in y ($v_i - vair_i$)
$wa_i$=air speed velocity in z ($w_i - wair_i$)
$uair_i$=x component of the wind velocity at a given point (can be measured or interpolated from the 3D wind vectors generated by the CFD model)
$vair_i$=y component of the wind velocity at a given point (can be measured or interpolated from the 3D wind vectors generated by the CFD model)
$wair_i$=z component of the wind velocity at a given point (can be measured or interpolated from the 3D wind vectors generated by the CFD model)
T=temperature in Celsius
P=air pressure in mm of Hg
El=elevation in meters
Rh=relative humidity
SVP=Saturation Vapor Pressure
SVP=$(0.61121 \ast e^{((18.678(T/234.5)) \ast (T/(257.17+T))))} \ast 760/101.325$
A=Cross Sectional Area of a baseball
Cd=Drag Coefficient=0.38

In this embodiment, the drag coefficient Cd is assumed to be constant. In other embodiments, the Cd may vary. The following Equations (7) and (8) are also used in the calculation:

$$x\text{lift}_i = -(\text{abs}(va_i \ast FFFa_i) \ast \text{sign}(va_i) + \text{abs}(wa_i \ast FFFa_i) \ast \text{sign}(wa_i)) \ast rho \ast A \ast Cl \ast 0.5 \qquad (7)$$

$$y\text{lift}_i = (\text{abs}(ua_i \ast FFFa_i) \ast \text{sign}(ua_i) + \text{abs}(wa_i \ast FFFa_i) \ast \text{sign}(wa_i)) \ast rho \ast A \ast Cl \ast 0.5 \qquad (8)$$

where sign(var)=1 for var>0, −1 for var<0, and 0 for var=0, and where Cl (lift coefficient)=0.225. In this embodiment, the lift coefficient Cl is assumed to be constant. In other embodiments, the Cl may vary.

In the other two dimensions, Y (being oriented at a 90 degree angle from the forward direction of ball contact), and Z (being the up direction perpendicular to the ground), the equations for motion are almost identical to the equations for x, when each corresponding item is changed to reference the dimension being determined (for example, when looking at the z direction, each $u_i$ is replaced with a $w_i$). Acceleration in the z direction must be treated differently because the force of gravity must be accounted for using Equation (9):

$$\Delta w_i = (((w\text{drag}_i + w\text{lift}_i))/\text{mass of baseball}) - g) * \Delta t \qquad (9)$$

where g=9.81 m/s². The lift equation in the z direction is as follows in Equation (10):

$$z\text{lift}_i = (\text{abs}(uai*FFFai)*\text{sign}(uai) - \text{abs}(vai*FFFai)*\text{sign}(vai))*rho*A*Cl*0.5 \qquad (10)$$

where sign(var)=1 for var>0, −1 for var<0, and 0 for var=0.

Figure 7:
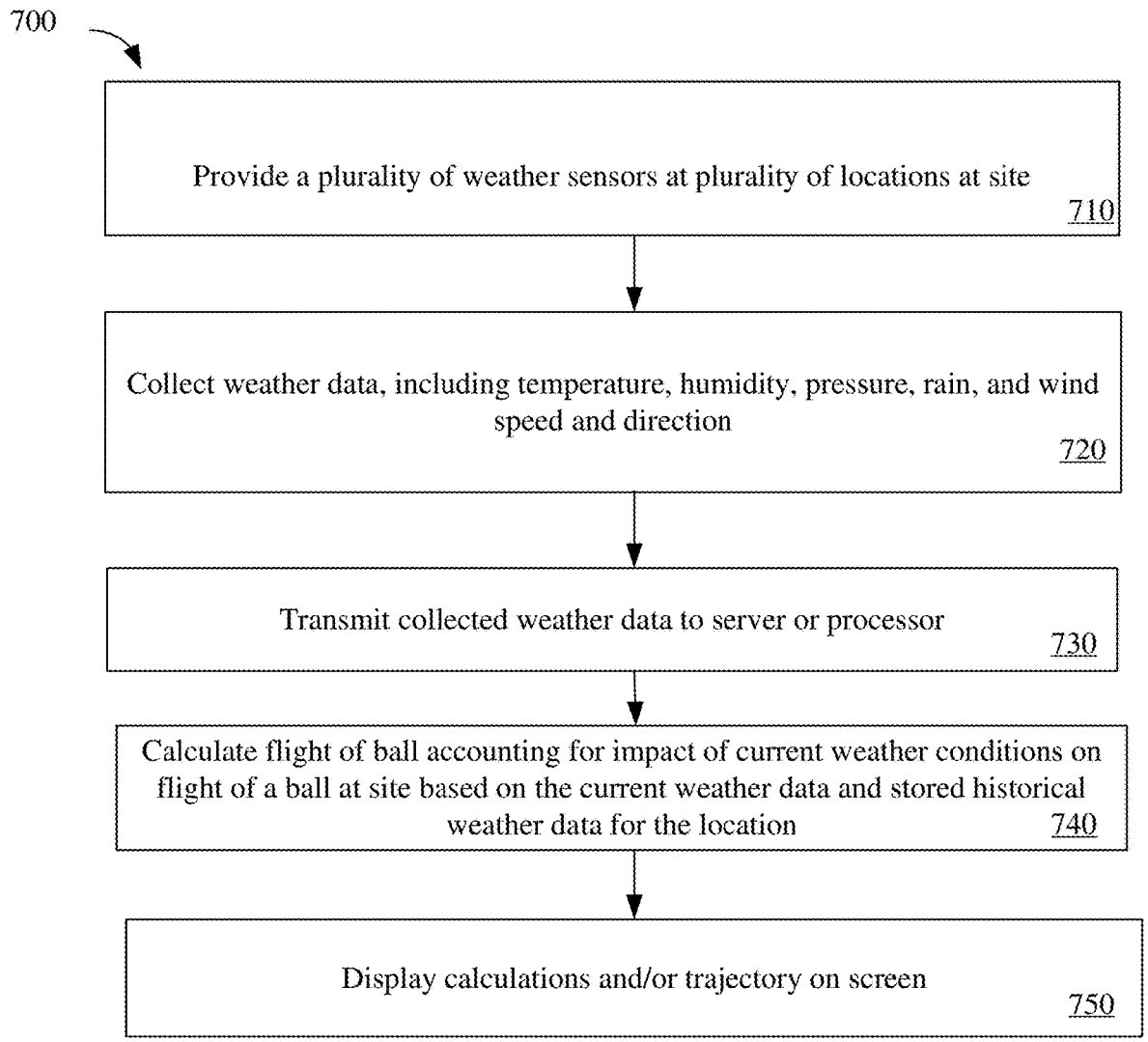
FIG. 7 is a flow chart of a method of predicting the of current weather conditions on the flight of a ball at a location in accordance with an embodiment.

FIG. 7 is a flow chart of a method 700 of predicting the impact of current weather conditions on the flight of a ball at a location. In Step 710, a plurality of weather sensors 110, are provided at different locations in the vicinity of an outdoor venue, such as a sports field or stadium, to collect weather data. These locations are preferably unobstructed. In Step 720, the weather sensors 110 (and LiDAR devices 120 and SODAR devices 130, if present) collect weather data, which can include temperature, humidity, pressure, precipitation, and wind speed and direction. The weather sensors 110 (and LiDAR devices 120 and SODAR devices 130, if applicable) then transmit the data to a server or processor 160 in Step 730. In some embodiments, the transmission of data to the server or processor 160 can be performed wirelessly. In certain embodiments, the weather data is first transmitted to a weather console 140, which, in turn, transmits the data to a data routing device 150, which then transmits the data to the server or processor 160. The method 700 further includes Step 740 in which the server or processor calculates the flight of a ball, accounting for the impact of current weather conditions on the flight of the ball at the site, based on the current collected weather data as well as stored historical weather data for the location. In Step 750, the calculated trajectory of the ball and calculated deviations based on weather can be displayed on a screen. Exemplary displays are shown in FIGS. 6A and 6B.

In accordance with an embodiment, the software on the server 160 performs several functions. The weather data are screened for accuracy by comparing the weather data collected from the weather stations 110 with each other. Any data that is determined to be out of bounds based on certain benchmarks is discarded. The data is then ingested into a model, which is based on the model described above, but is in a form that is conducive to quick calculations, where the model output is created in a fraction of a second using a combination of computer programming languages, including C, Python, and Perl. The model output gives the number of feet added to or taken away from the flight of the baseball by the current weather conditions in real-time. That information can be sent to and displayed on a website or screen, and can be updated frequently. According to an embodiment, the information is updated frequently (e.g., roughly every 2-20 seconds). The server or processor 160 can also archive the data and the calculations made.

In accordance with another embodiment, computational fluid dynamics (CFD) modeling is employed. A Computer Aided Design (CAD) model of the outdoor sports venue or stadium is created to use in the CFD modeling. According to this embodiment, wind is measured upstream of the stadium by wind sensors, such as anemometers, instead of positioning wind sensors in the stadium or outdoor sports venue. Other suitable wind sensors include LiDAR and SODAR devices. Alternatively, the upstream wind data may be obtained from commercial and/or public sources. In a particular embodiment, the wind sensors are positioned about ⅛-¼ mile upstream of the stadium such that wind measurements at about ⅛-¼ mile upstream of the outdoor sports venue can be used in the CFD model. At some stadiums (e.g., stadiums that have a consistent sea breeze), the wind consistently blows in a certain direction, and the wind sensors can be positioned upstream of the stadium in a particular direction. However, at other stadiums, the wind direction may not be so consistent, and wind sensors will need to be positioned in different directions in the vicinity around the stadium in order to be able to measure the wind upstream of the stadium on any given day. In other embodiments, the wind sensors can be positioned downstream of the stadium or in another convenient location in the vicinity of the stadium.

It will be understood that, in this embodiment, the wind sensors should be positioned far enough away upstream from the stadium and other structures (e.g., billboards) such that an increase in wind speed due to compression does not occur where the wind sensors are positioned. Thus, it will be understood that the distance of the wind sensors from the stadium is site specific. In most embodiments, the distance of the wind sensors from the stadium is likely to be in the range of about ⅛-½ mile.

The wind measurements by the wind sensors or wind data are used as inputs into a CFD model that produces 3D wind vectors at grid-points above the field across the entire stadium. These 3D wind vectors are used as inputs into the trajectory model described above. As described above, the trajectory model calculates the distance and direction that a given ball will travel under current weather conditions. Linear interpolation can be used to determine the wind at the actual point of the ball.

As described below, according to an embodiment, a CFD model can be used to provide the wind components in the stadium coordinate system even though the wind data are collected outside the stadium, where $x_s$ is zero at home plate and increases going toward the right field foul pole, $y_s$ is zero at home plate and increases going toward the left field foul pole and $z_s$ is just z, where z equals zero on the ground and increases vertically.

Using the data from the CFD model, the wind components are then linearly interpolated to each position of the ball at each time step on its trajectory. In order to calculate the trajectory of the ball, the wind components are resolved along (tangential) and perpendicular (normal) to the horizontal components of the original path of the ball. The vertical winds do not require any transformation. This is a two-step process.

First, the interpolated winds in the stadium coordinates are transformed into winds blowing from the standard west to east ($uair_g$) and south to north ($vair_g$) components. This could be referred to as compass or standard meteorological components. The equations for this transformation are as follows:

$$uair_g = uair_s*(\cosine(\overset{.}{A})) + vair_s*(\sine(\overset{.}{A})) \qquad (11)$$

$$vair_g = vair_s*(\cosine(\overset{.}{A})) - uair_s*(\sine(\overset{.}{A})) \qquad (12)$$

where $uair_s$ and $vair_s$ are the horizontal components of the wind in the $x_s$ and $y_s$ directions respectively, as defined above, and where Å=stadium orientation angle –225 degrees and where the stadium orientation angle=the compass heading from home plate to straight away center field+180 degrees.

Next, the compass or meteorological winds are converted into tangential and normal wind components to the horizontal components of the original path of the ball. This conversion is done using the following Equations (13) and (14):

$$dd=\arctan(-uair_g/-vair_g) \quad (13)$$

$$ff=((uair_g)^2+(vair_g)^2)^{0.5} \quad (14)$$

where dd=the compass heading from which the wind is blowing and
where ff=horizontal wind speed.

The tangential wind angle (tanwinang) and the normal wind angle (norwinang) are determined as follows, using Equations (15) and (16):

$$\text{tanwinang}=dd-\text{ballangzero} \quad (15)$$

$$\text{norwinang}=\text{tanwinang}+90 \text{ degrees} \quad (16)$$

where ballangzero=stadium orientation angle+ball angle, and ball angle=–45 degree to the left field foul pole, zero degrees to straight away center field, and 45 degrees down the right field foul line, and $$uair_i=f\!f_i^*(\cosine(\text{tanwinang}_i))$$

$$vair_i=f\!f_i^*(\cosine(\text{norwinang}_i))$$

One CFD model that is suitable for use in this embodiment is ANSYS CFD software available from ANSYS of Canonsburg, Pa. The calculations in the CFD model can be made in real-time. Other CFD models, such as OpenFOAM, SolidWorks, Star-CCM, COMSOL's CFD Module, Altair's AcuSolve, can also be used to generate 3D wind vectors. In some embodiments, LiDAR can be used to measure the wind within the stadium in order to verify the 3D wind vectors generated by the CFD model. Other wind sensors, including drones, SODAR devices, and anemometers can also be used to verify the 3D wind vectors generated by the CFD model. Thus, LiDAR will not be used in real-time in this particular embodiment, but rather LiDAR, at different grid-points, can be used to measure the actual winds in the stadium, to verify the CFD generated 3D vectors.

In accordance with another embodiment, a number of preassigned CFD test cases are used to feed the trajectory model described above. In this embodiment, several wind inputs are thoroughly calculated ahead of time, and then live measurements are fitted to these calculations. In this setup, CFD modeling is not performed live. Instead, pre-calculated lookup tables are used for the 3D vector grid points.

In addition to CFD and direct measurements, there are other ways which estimate (parameterize or approximate) the wind inside of an outdoor sports venue. These estimated approaches are less desirable for use in large stadiums or outdoor sports venues that have large, solid, or high obstructions to the wind entering the sports venue, because they provide less accuracy for such venues. That is, these type of obstructions typically result in very complex wind flow inside the sports venue. However, in less-obstructed, more wide-open sports venues, estimation (parameterization or approximation) can be used and still provide useful results for wind flow.

One such estimation method is the use of a log wind profile. Simply put, wind speed increases logarithmically with height. Thus, according to another embodiment, log wind profiling is used instead of CFD modeling. The log wind profiling method is described in more detail below with respect to golf. However, it will be understood that log wind profiling can be applied to other sports as well.

Golf

An embodiment for modeling the trajectory of golf shots, both in real time and in the future, is described below. Typically, golf shots are taken all over a golf course, not just at an initial location. Thus, all of the obstructions (e.g., tree canopies), elevation differences, the direction (or intended direction) of the shot, the distance (or intended distance) of the shot, and variations of weather conditions at different locations at different times should be taken into account for each golf course.

According to an embodiment, specific CFD modeling is performed for each golf course. In this embodiment, a CAD model of the particular golf course is created to use in the CFD modeling. The CAD model can be created using mesh data from Google Earth, which is then used to create the CAD model. The CAD model of the golf course provides a three-dimensional wind field over the entire golf course. This three-dimensional wind field is integrated into trajectory models, as described above, to calculate the impact of the wind over the flight of the ball.

According to another embodiment, generalized CFD modeling is used for all golf courses. As CFD modeling is typically expensive and time consuming, generalized CFD modeling allows for information learned from full CFD modeling to be applied to a larger set of golf holes that are classified into types. There are many ways to classify golf holes. In a particular embodiment, the golf holes are generalized into types, based on how they are bounded by canopy, i.e., all sides, 3 sides, 2 sides, 1 side, no sides.

Figure 10:
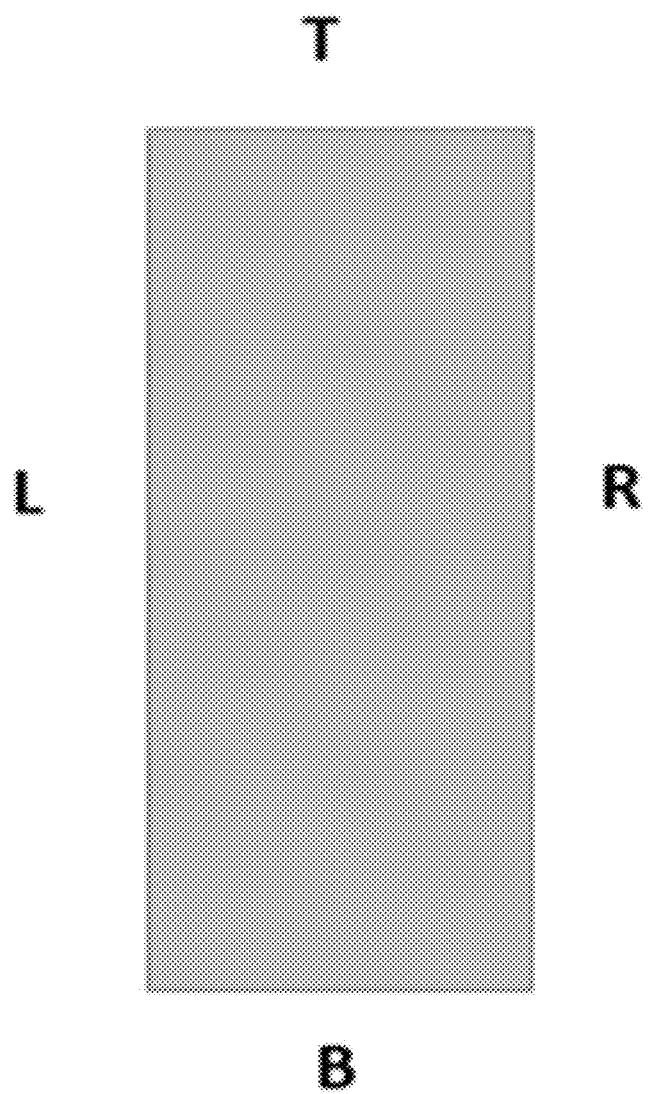
FIGS. 10-12 are schematic rectangular representations of golf hole segments used in CFD modeling.
Figure 11:
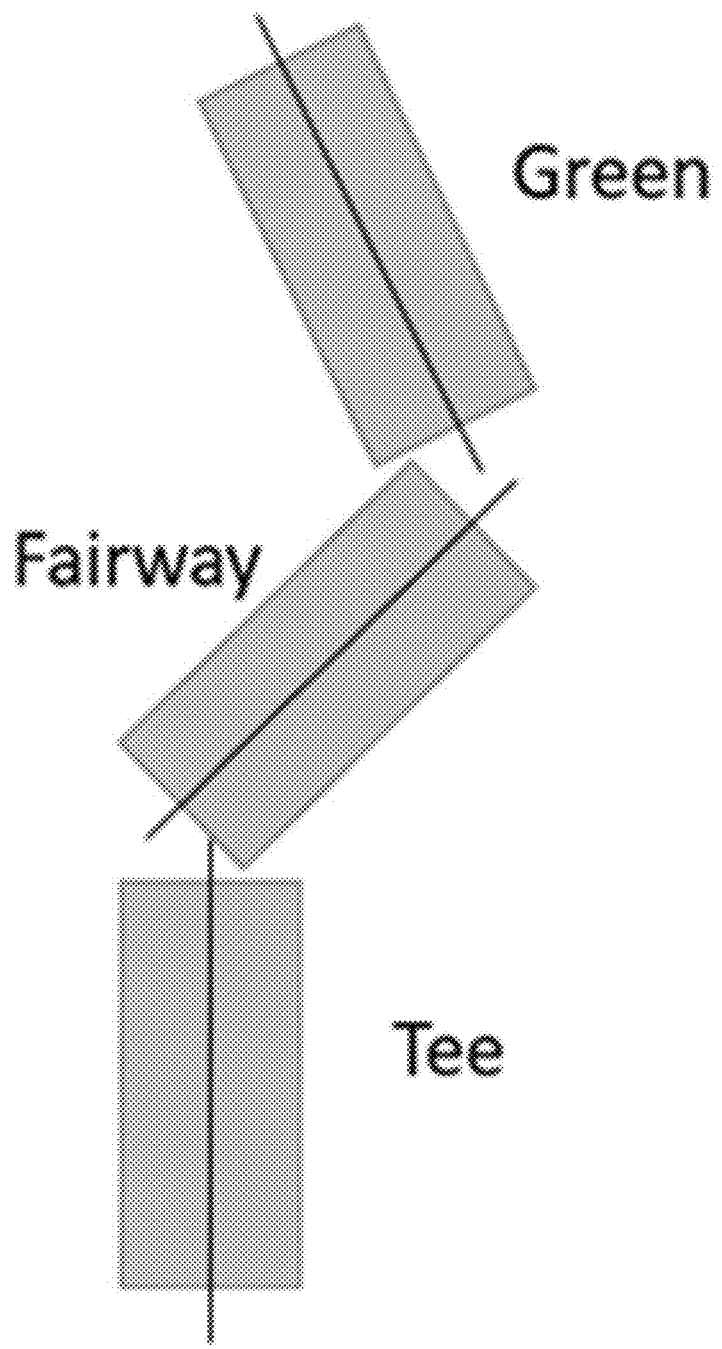
Figure 12:
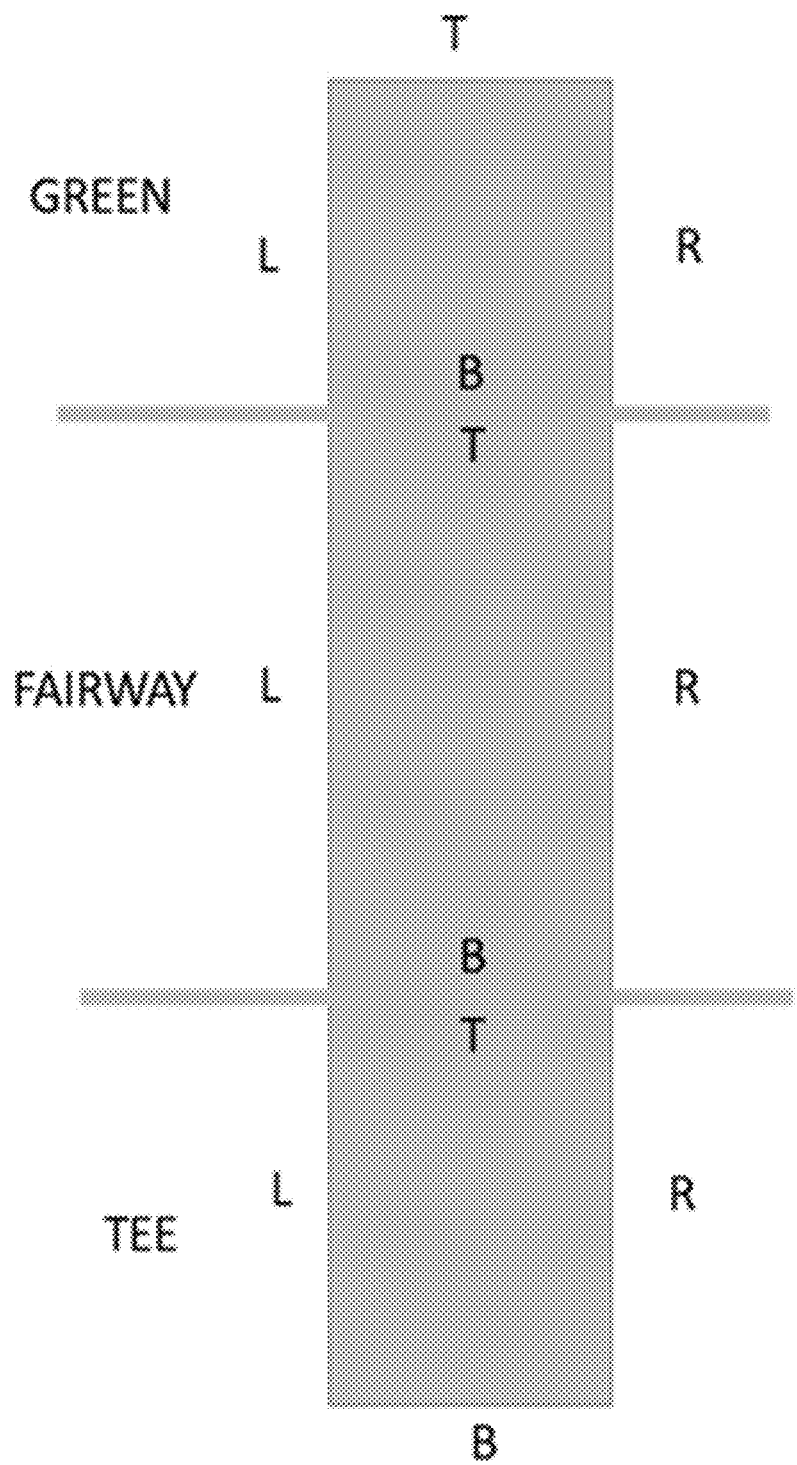

Each golf hole consists of a tee, fairway, and green, each of which can be represented by a rectangle bounded by 4 sides: T=Top, B=Bottom, L=Left, R=Right, as shown in FIG. 10. Each of these rectangles can be connected to another rectangle at an arbitrary angle, as shown in FIG. 11. A straight golf hole is represented as shown in FIG. 12. Each rectangle segment is then assigned separate boundary conditions, where 0, 1, 2, 3, or 4 sides are bounded with canopy as follows:

Bounded:
1—L-R-T-B
2—L-R-T
3—L-R-B
4—T-B-R
5—T-B-L
6—T-B
7—T-L
8—T-R
9—B-R
10—B-L
11—L-R
12—T
13—B
14—L
15—R
16—OPEN In this embodiment, 864 CFD cases are run based on the following four assumptions. The first assumption is that the wind speeds are 12, 24, and 36 mph (i.e., three wind speeds). The second assumption is that model runs are at 20-degree increments (i.e., wind from 0 degrees, 20 degrees, 40 degrees, etc.) Thus, there are 18 cases per wind speed. The third assumption is that the total number of CFD cases run in this embodiment is as follows: (a) three wind speeds*18 cases/wind speed=54 wind cases for each of the 16 different types of bounded canopy around the hole segments; and (b) 16 combinations of bounded canopy*54 cases per segment=864 CFD cases. The fourth assumption is that: (a) the typical fairway length is 400 meters; (b) the typical fairway width is 50 meters; (c) the average bounded canopy height is 15 meters; and (d) interpolations are made for three-dimensional wind speeds in between the three wind speeds and in between the 18 wind directions.

Using satellite data, Google Earth, maps, and any other method, each golf hole of a golf course is classified into some combination of these 16 segment types and the angle connecting the hole segments. A segment length factor is also assigned for each segment. The configuration is then "stitched" together to obtain a resulting hole.

The "stitching" can be performed by mapping the velocity components from the end of one region/rectangle to the beginning of the next region/rectangle. This procedure is also known as "sub-modeling" in the computational field. The process of mapping the velocity components from one rectangle to another can be performed by a processor implementing computer code implementing linear interpolation.

According to another embodiment, the wind profile of a golf course is modeled without using CFD modeling. In this embodiment, the impact of the wind on a golf shot is determined using a log wind profile. In order to calculate the impact of the wind on a shot, the elevation of the ground and canopy height need to be determined for any location on the golf course. In this embodiment, the first step is to overlay a high-resolution grid on the golf course (e.g., 2 meters by 2 meters). The height of the actual canopy above the ground and the elevation of the ground at each grid point need to be determined. The canopy height and ground elevation may be obtained from satellite data sets of: (a) combined ground and actual canopy elevation; (b) actual canopy height above the ground; and (c) foliage density (varies seasonally). These data sets are available from third parties, such as EcoAcumen. The combined ground and actual canopy elevation as well as the actual canopy height above the ground are interpolated to the golf course grid. The gridded actual canopy height is subtracted from the gridded combined ground and actual canopy elevation to obtain the gridded ground elevation.

According to this embodiment for modeling the wind profile, the effect of the canopy on the wind is calculated at given points (horizontally and vertically) on the golf course to accurately model the trajectory of the ball. It will be noted that the wind impact on a ball that travels closer to a canopy is less than the wind impact on a ball that is farther from a canopy.

The effective canopy height is defined as the elevation where the wind below it would drop to zero in a vegetated area. The effective canopy height, D, is determined for the whole golf course based on a fraction of the average tree height, which can be seasonally adjusted for foliage density. The effective canopy height, d, is then calculated for each grid point (as opposed to D for the whole golf course). The effective canopy height is used in calculations below.

In this embodiment, each bare ground grid point (grid point without a canopy, e.g., fairway or tee box) has two weighting factors. The first weighting factor is inversely proportional to the square of the distance to the nearest canopy grid point. The second weighting factor is the weighted average of the actual nearby canopy heights. This weighted average is taken from all the actual canopy heights within a given radius of that canopy grid point, weighted by the inverse square of their distance from the canopy grid point.

Each canopy grid point is weighted by the second factor only because it is actual canopy. The sum of the two factors varies between 0.6 and 1.25 and multiplies the effective canopy height, D, for the whole grid or course to determine d, the effective canopy height at each grid point.

The absolute value of the sine of the angle the wind makes with the golf shot angle multiplies the gridded effective canopy height resulting in a value between 1 and 0.5 multiplying the effective canopy height, d, for each grid point with the lowest value of 0.5 for a wind that aligns with the golf shot as it will blow up or down the fairway and thus be less affected by the canopy alongside the fairway. The highest value of 1 applies to winds perpendicular to the golf shot as those winds blow across the fairway and are thus more affected by the canopy alongside the fairway.

According to this embodiment, the horizontal wind field over the flight of the ball is calculated using three vertical layers: (1) the log layer (above the tree tops), (2) the transition layer (the upper third of the height of the trees), and (3) the subcanopy layer (the bottom two-thirds of the height of the trees). The wind field is broken into three vertical layers because wind acts differently at different heights above the ground.

Log Layer

In this particular embodiment, the log layer is the layer that is above 5/3 the effective canopy height, the transition layer is the layer between the effective canopy height to 5/3 the effective canopy height, and the subcanopy layer is between the transition layer and the ground (below the effective canopy height).

The log layer is unbounded on the top and defined on the bottom by $z_e = 5/3\ z_d$. $z_d$ is the effective height of the canopy, where canopy is defined as the average height of nearby tree tops. Effective height of the canopy is the height above the ground but below the top of the trees, within the canopy, where wind speed goes to zero. This happens because trees are very efficient at absorbing and thereby minimizing wind. It is estimated that somewhere between 0.5 and 0.8 of the height of the canopy, the wind speed inside the canopy drops to zero. Thus, according to this embodiment, 5/3 of $z_d$ is selected based on comparisons with measured winds.

In order to more accurately estimate the winds in the log layer, undulations in the topography itself and the buoyancy stability of the atmosphere (temperature variation with height) should be taken into account, resulting in the following log wind profile equation:

$$U(z_q) = \frac{U_0 \ln\left(\frac{z_q}{z_0}\right)}{\ln\left(\frac{2z_d}{3z_0}\right) - stab} \quad (A1)$$

where U is the wind speed and $z_q$ is the height above the ground.

According to this embodiment, wind data (from wind sensors and/or from wireless communication networks) (at height substantially equivalent to $z_c$) is interpolated at a grid point at altitude $z_e$ where $z_e$ is the interpolated wind value at the bottom of log layer. As noted above, $z_e = (5/3)z_d$ and where $z_d$ is the effective height of the canopy. Then the log wind profile equation (Equation A1) is used for all points above that point to calculate the horizontal wind U(z) in the log layer (for $z_q > z_c$). It will be understood that $U(z_q)$ is the horizontal wind speed as a function of altitude $z_q$ above the ground. $U_0 = U(z_c)$, the wind speed at the bottom of the log layer. As noted above, $U_0$ is interpolated from either nearby wind measurements or wind model inputs.

In Equation A1, $z_0$=surface roughness, which is a parameterization of how much the underlying topography varies. For example, over a completely flat area, $z_0$=0. While over the most extreme mountains and valleys, $z_0$=1. For most golf courses, $z_0$ is roughly about 0.10.

Stability matters because if the atmosphere is unstable, i.e., temperatures decrease rapidly with height, then the strong winds aloft will readily mix down closer to the surface. Conversely, if the atmosphere is very stable, i.e., temperatures decrease very slowly (or even increase) with height, then the strong winds aloft have a tougher time mixing downward toward the ground. It will be understood that stab=atmospheric static stability, and is a number between −1 (unstable) and 2.5 (quite stable) that affects how readily the winds above can mix down to the lower layers.

Transition Layer

In the transition layer, winds are impeded by trees, which are taken into account in this embodiment. The transition layer is in between the linear wind profile (bottom (sub-canopy) layer) and the unimpeded log wind profile (top (log) layer). The wind at the bottom of this transition layer must match the top wind at the top of the bottom (subcanopy) layer ($U_{lo}$). The wind at the top of this transition layer must match the wind at the bottom of the top (log) layer ($U_0$).

For the transition layer, this is done logarithmically. Equation A2 is used to calculate the horizontal wind $U(z)$ in the transition layer (for $z_{lo} < z_q < z_c$).

$$U(z_q) = U_{lo} + A^* z_n + B \quad (A2)$$

where $z_{lo}$ is the bottom of the transition layer (or about ⅔ the canopy height) and is represented by $z_{lo} = z_d + z_0 e^{Vk}$ where Vk is the Von Karman constant (0.41). This is used routinely in atmospheric modeling to account for momentum fluxes. This parameterizes vertical momentum mixing of the air due to turbulence near a boundary (friction parameterization). In this embodiment, the boundary is the ground. $U_{lo} = U(z_{lo}) = U_0/e^{Vk}$; $z_n = \ln((z_q - z_d)/z_0) - $stab. In Equation A2, A and B are constants by solving Equation A2 such that $U(z_{lo}) = U_{lo}$ and $U(z_c) = U_0$, as discussed above.

Subcanopy Layer

In the subcanopy layer, the wind varies linearly from a speed of zero at the ground to $U_{lo}$ at the top of the subcanopy layer. Equation A3 is used to calculate the horizontal wind $U(z)$ in the subcanopy layer (for $0 < z_q < z_{lo}$).

$$U(z) = U_{lo} * z_q / z_{lo} \quad (A3)$$

where $U(z)$ varies linearly with height with $U(z)$ at the surface=0.

For all of the cases described above: Specific CFD modeling for each course, Generalized CFD modeling for all courses, and Wind Profile without CFD modeling, the end of the golf ball flight can be determined in a similar manner. For the control case (no wind with average weather conditions), the control elevation change is the difference in bare ground topographic surface elevation from the initiation of the golf ball flight until the termination of the golf ball flight, which occurs when a descending golf ball's elevation is first less than or equal to the elevation of the bare ground topographic surface. For the weather affected case, the golf ball flight is terminated when its elevation change is first greater than or equal to the absolute value of the control elevation change for a descending golf ball.

Cricket

An embodiment can be used to model the trajectory of cricket balls both in real time as well as in the future. This embodiment is similar to the modeling for baseball described above. However, in this embodiment, the output is applied to 12 positions around a cricket field, as shown in FIG. 13.

Figure 13:
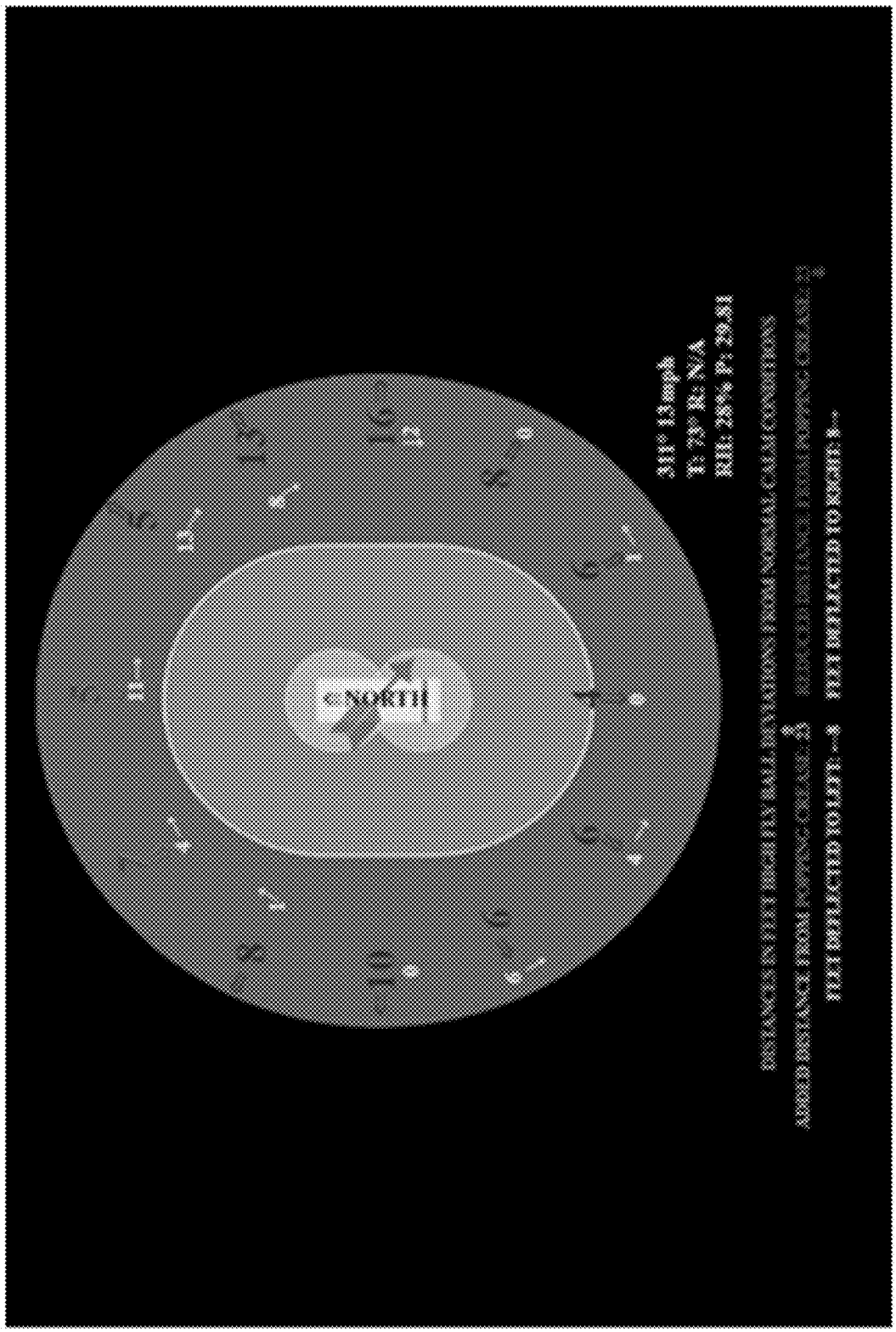
FIG. 13 shows an example of real time wind impact on the flight of an average fly ball in cricket to different locations on a cricket field.

FIG. 13 shows an example of real time wind impact on the flight of an average fly ball in cricket to 12 different locations on a cricket field. As shown in the exemplary screenshot display of FIG. 13, the larger numbers indicate that the wind is either extending or shortening (as indicated by the adjacent arrows) the flight of the ball and also the magnitude of the impact. In the illustrated example of FIG. 13, the large number "5" in the center top and the "7" to the left of the center "5" indicate that the wind is shortening the flight of the ball by 5 and 7 feet, respectively. All other larger numbers in this example indicate that the wind is lengthening the flight of the ball. The smaller numbers in FIG. 13 show deflection of the flight of the ball caused by the wind, and the direction of the deflection is indicated by the adjacent arrow. In this particular example, units are in feet. The large arrow in the center of the field indicates the direction of the prevailing wind.

The modeling for cricket is similar to that of baseball described above. It will be noted that there are differences in cricket, which result in slightly different modeling than that of baseball. For example, the cricket ball is slightly smaller and slightly heavier than a baseball. Exit velocities of cricket balls are typically 85% of that of baseballs. Also, the cricket bat is substantially flat, which generally results in less spin on the ball when the ball is hit by a cricket bat. The spin rate of a cricket ball is about 60% of that of a baseball. Overall, these differences are not significant and the ballistic equations are the same with change, such as changes only in coefficient values.

Football

According to an embodiment, the trajectory of footballs can be modeled both in real time and in the future. This modeling is similar to the modeling for baseball as described above, but, for football, the output is applied to two directions for a field goal kick from 50-yard line (see FIG. 14) and a punt from the 25-yard line (see FIG. 15).

Figure 14:
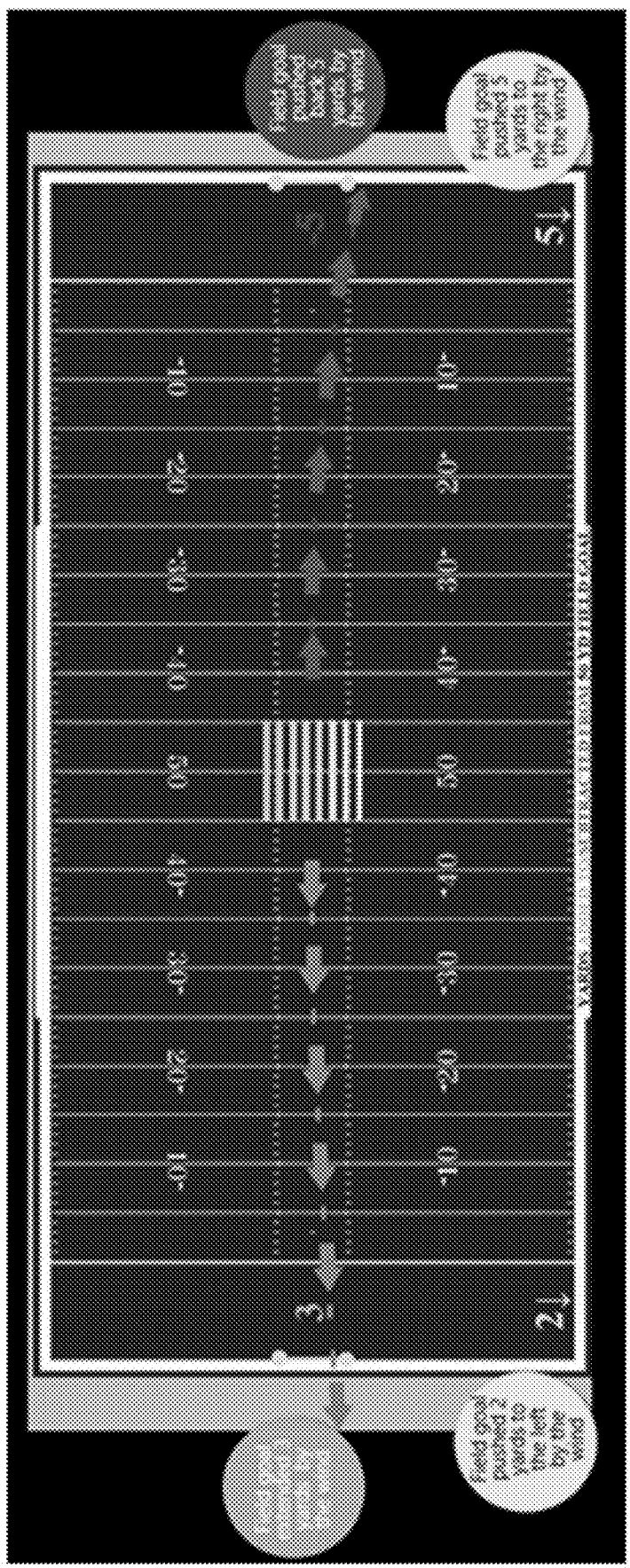
FIGS. 14-16 show examples of real-time wind impact on the trajectory of a football on a football field.

FIG. 14 shows an example of real-time wind impact on the flight of an average field goal that is kicked in football. In this example, as shown on the left side of FIG. 14, the trajectory of the kicked football is lengthened by 3 yards and pushed to the left 2 yards by the wind. As shown on the right side of FIG. 14, the trajectory is shortened 5 yards and pushed to the right 5 yards by the wind in this example.

Figure 15:
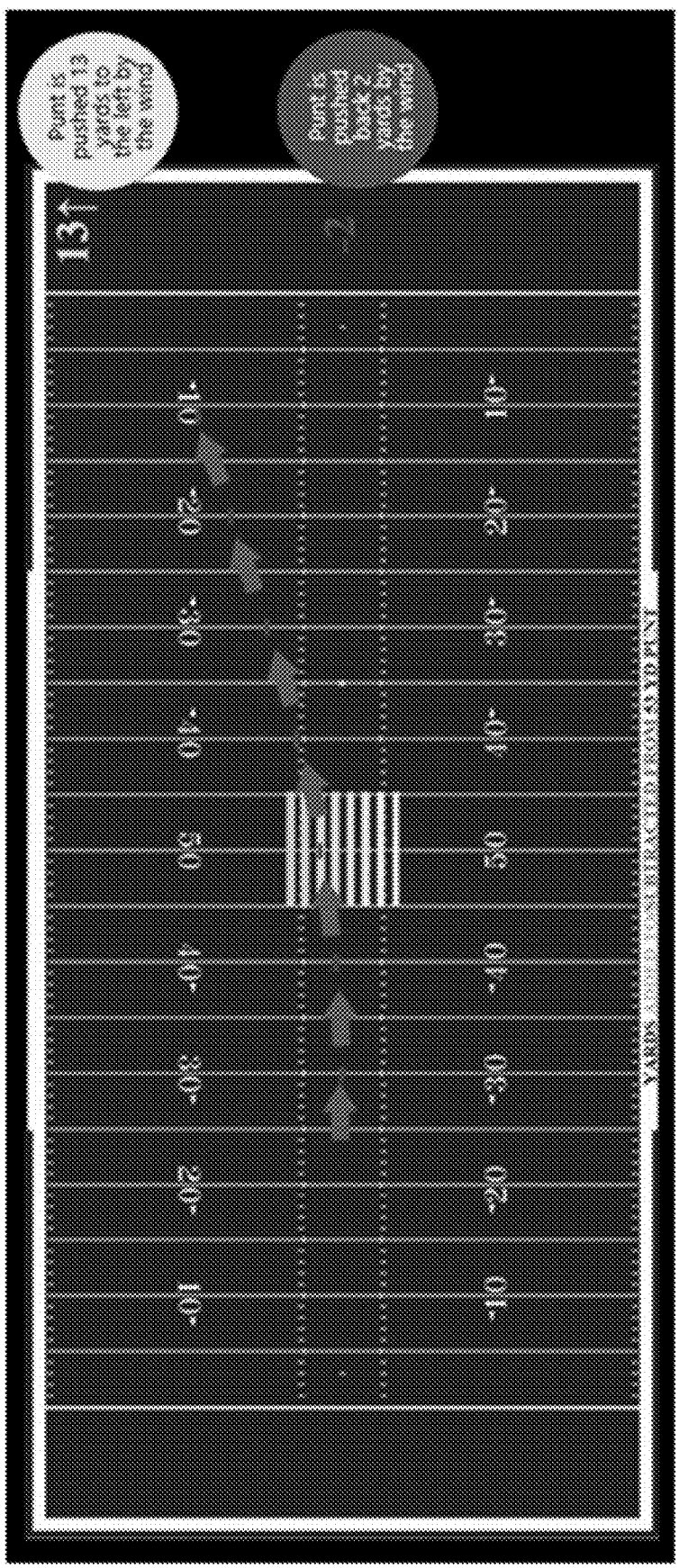

FIG. 15 shows an example of real-time wind impact on the flight of an average punt from the 25-yard line. The trajectory is lengthened by 2 yards and pushed to the left 13 yards in this example.

According to an embodiment, specific field goals and punts can be entered by clicking the snap location and aiming point on a gridiron screen display. Also specific meteorologic conditions of wind direction, wind speed, temperature, relative humidity, and pressure/elevation can be entered using screen slide bars on the screen display. The resulting trajectories in both field directions are then calculated and those trajectories along with the length deviations and directional deflections in yards from average calm conditions are displayed similar to the examples shown in FIGS. 14 and 15.

Figure 16:
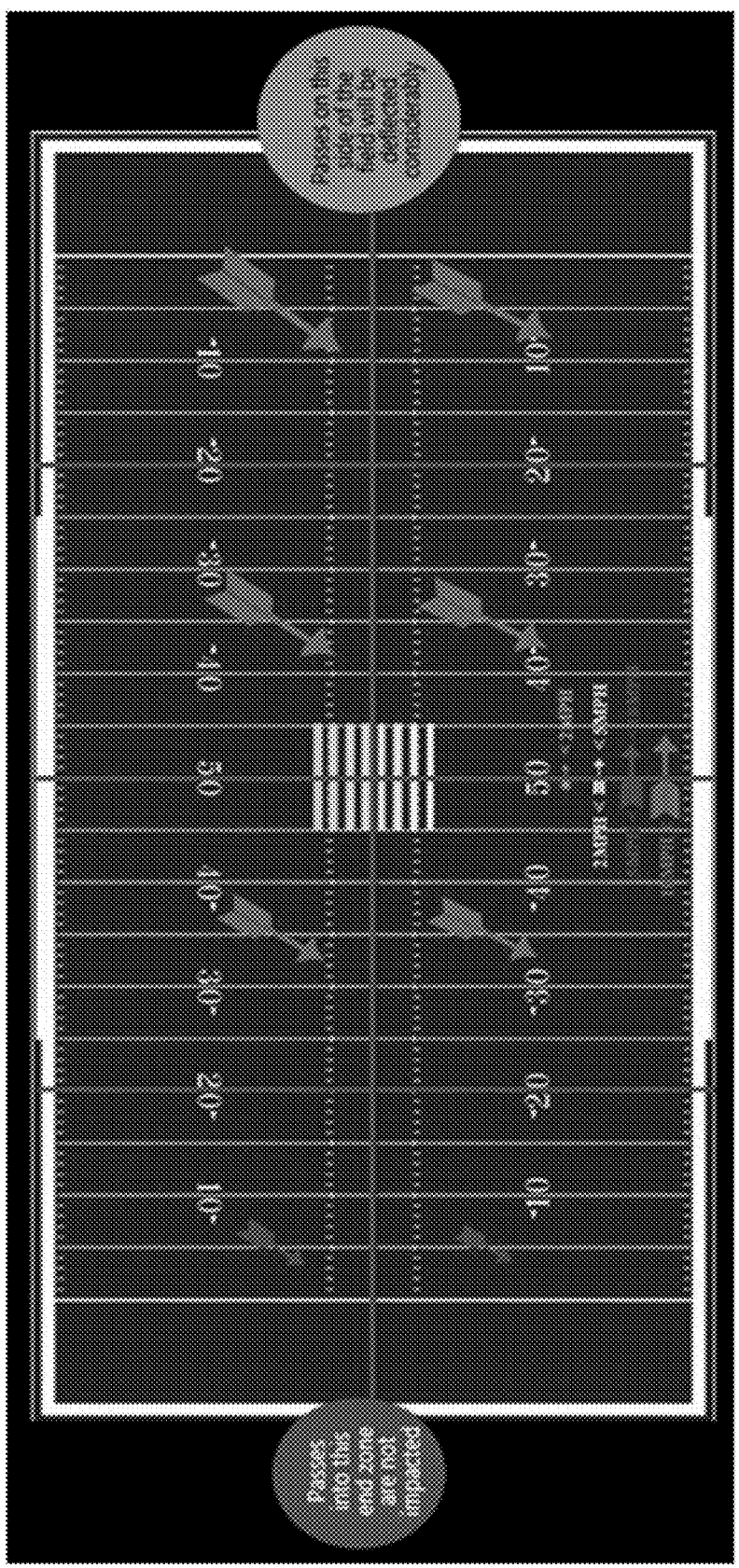

It will be noted that weather will also affect passes in addition to field goal kicks and punts. According to an embodiment, to determine the impact of weather on passes, the football field is separated into eight sections, as shown in FIG. 16. The impact of wind is determined for each of these eight sections. It will be understood that the football field can be separated into more or fewer sections in other embodiments. The screen display shown in FIG. 16 shows how the wind impacts passes in each of these sections representing particular areas of the field.

There are other differences in football, which result in different modeling than that of baseball. For example, the shape of a football is significantly different than that of a baseball and it travels through the air differently depending on whether the football is thrown, punted, or kicked from the ground (kick off or field goal). Therefore, different cross-sectional areas of the football are used for the different cases, based on the wind direction relative to the ball. This requires the use of different drag and lift coefficients that vary with the wind direction and speed relative to the motion of the football.

For field goal kicks, the drag coefficient is 8/7 its value for punts. For both punts and field goals, the drag coefficient for components of motion perpendicular to the original (tangential) motion of the ball, the drag coefficient is 1.5 times its tangential value as the larger cross-section of the football is always presented to perpendicular air flow.

Additionally, since footballs are inflated with air, adjustments are made for ball inflation based on air temperature and barometric pressure. For example, the launch speed of the football is reduced for colder temperatures (< about 65° F.) by launch speed=given launch speed+coefficient*(Tf−65) where Tf is the current temperature and coefficient is 0.104 mph/deg.

It is important to point out that the ballistic equations for footballs are the same as with baseballs. The differences are with coefficient values due to the ratio of the mass to the cross-sectional area of the ball.

Volleyball

Figure 17:
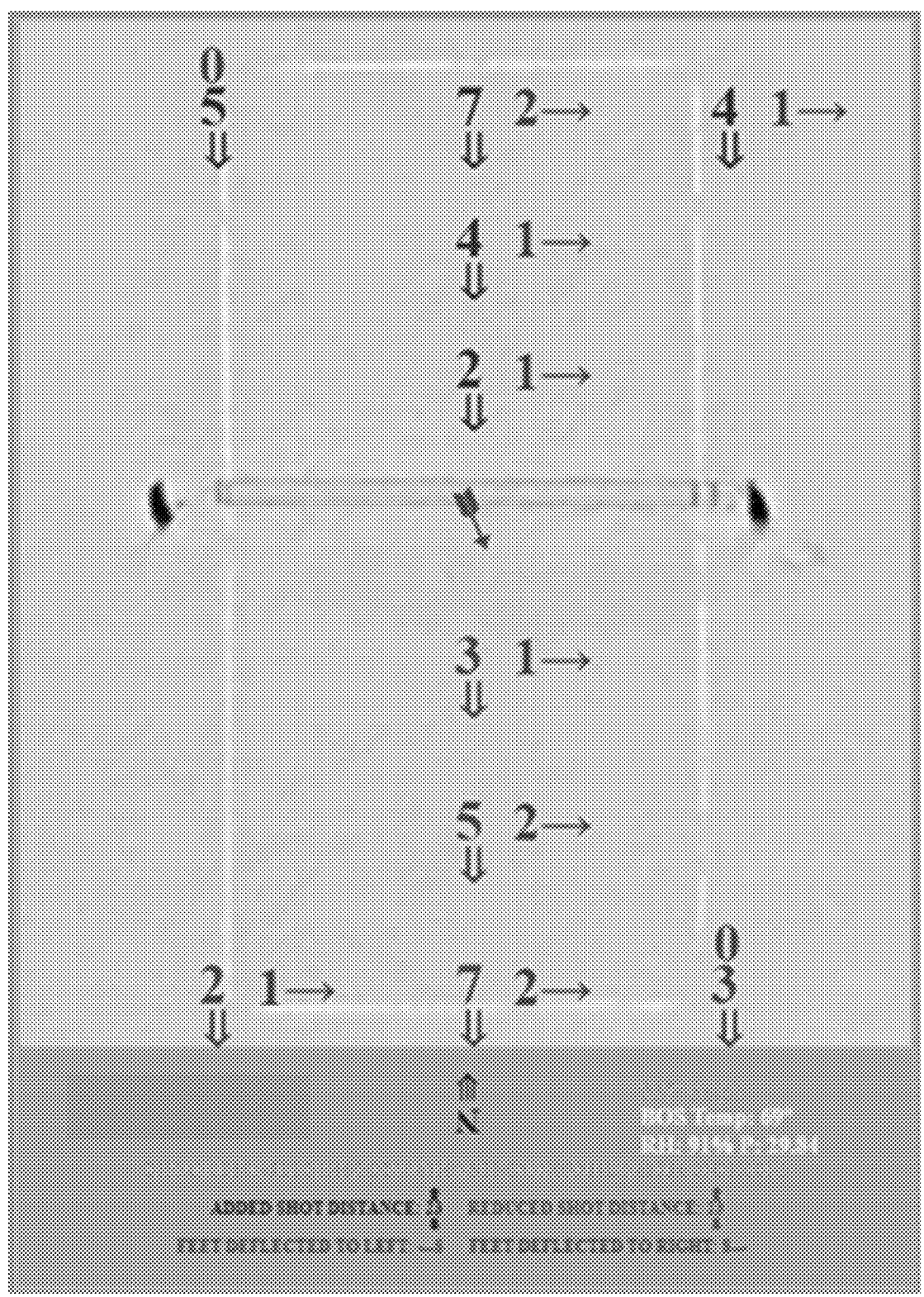
FIG. 17 illustrates an example of real-time wind impact on the trajectory of a volleyball at an outdoor volleyball court.

According to an embodiment, the trajectory of beach volleyballs can be modeled both in real-time and in the future. FIG. 17 illustrates an example of real time wind impact on the trajectory of an average jump serve, float serve, pass, and set from each side of the court. In this embodiment, the numbers and arrows indicate the magnitude and direction of the wind impact n the ball. In the illustrated embodiment, the magnitude of the impact is indicated in feet. As shown in FIG. 17, the wind can either shorten or lengthen the trajectory of the ball, depending on the location. FIG. 17 also shows wind caused deflection to the left or right. In this embodiment, north is on the top of the court. Jump serves are on each corner. Float serves are in the middle of each end line. Passes are the center of each half court. Sets are the numbers closest to the net. In this particular example, when jump serving from the north left, the average serve is extended by 5 feet and deflected 0 feet. When jump serving from the right, the average serve is extended by 4 feet and deflected 1 foot to the right. The average float serve is extended by 7 feet and deflected 2 feet to the right. The average pass is extended 4 feet and deflected to the right by 1 foot. The average set shot is pushed 2 feet closer to the net and deflected 1 foot to the right. In FIG. 17, the arrow in the center of the net represents the prevailing wind.

The modeling for outdoor volleyball is similar to football, except the cross-sectional area does not change because the volleyball is spherical. Therefore, coefficients do not change with the ball's relative motion to the wind. The drag coefficient is increased to 1.5 times its baseball value so that the terminal velocity of the volleyball is appropriate.

Although only a few embodiments have been described in detail, it should be appreciated that the invention may be implemented in many other forms without departing from the scope of the invention. In view of all of the foregoing, it should be apparent that the present embodiments are illustrative and not restrictive and the invention is not limited to the details given herein, but may be modified within the scope and equivalents of the appended claims.

What is claimed is:

1. A computer-implemented method of determining an impact of weather parameters on a flight of a ball at an outdoor sports venue, the method comprising:
   providing a digital model of the outdoor sports venue to a processor;
   at the processor, obtaining real-time data for at least one weather parameter at or near the outdoor sports venue, wherein the at least one weather parameter is wind,
   at the processor, inputting the real-time data for the at least one weather parameter into a computational fluid dynamics (CFD) model;
   at the processor, using the CFD model with the inputted real-time data and the digital model of the outdoor sports venue to produce three-dimensional wind vectors at grid-points in the digital model of the outdoor sports venue;
   at the processor, using the three wind vectors to calculate a trajectory of the ball at the outdoor sports venue based on the real-time data obtained for the at least one weather parameter, the calculated trajectory of the ball accounting for the impact of the at least one weather parameter; and
   displaying on a screen the calculated trajectory of the ball or calculations based on the calculated trajectory of the ball, wherein the outdoor sports venue is a golf course and the digital model of the outdoor sports venue comprises a plurality of rectangles, each rectangle representing a segment of a golf hole and each rectangle being characterized based on how the rectangle is bounded by canopy, and wherein the CFD model uses linear interpolation to map velocity components from an end of one rectangle to a beginning of a next rectangle.

2. The method of claim 1, wherein obtaining the real-time data further comprises receiving the real-time data from at least one weather sensor positioned at or near the outdoor sports venue.

3. The method of claim 2, wherein the at least one weather sensor comprises at least one of a LiDAR device, a SODAR device, and an anemometer.

4. The method of claim 3, wherein the at least one weather sensor comprises at least one weather sensor positioned about ⅛-½ mile upstream of the outdoor sports venue for obtaining wind data.

5. The method of claim 1, wherein the at least one weather parameter further includes humidity, barometric pressure, and temperature.

6. The method of claim 1, wherein the at least one weather parameter further includes precipitation.

7. The method of claim 1, wherein the digital model is a computer aided design (CAD) model.

8. The method of claim 1, wherein the digital model of the outdoor sports venue includes surroundings of the outdoor sports venue, wherein the surroundings include a radius that is 2-20 times the length or diameter of the venue.

9. The method of claim 1, wherein obtaining the real-time data comprises receiving the real-time data from a wireless communication network, the wireless communication network collecting the real-time data sourced from cellular transmission signals including signal attenuation information.

10. A system comprising:
a data storage that contains wind model data for an outdoor sports venue;
at least one processor, wherein at least one processor contains a digital model of the outdoor sports venue; and
a machine-readable medium including instructions stored therein, which when executed by the at least one processor, causes the at least one processor to perform operations in real-time comprising:
at the at least one processor, obtaining current weather data comprising wind data;
at the at least one processor, calculating a trajectory of a ball at the outdoor sports venue, using the wind model data and the current weather data, taking into account impact of current weather conditions on movement of the ball at the outdoor sports venue based on the obtained current weather data for current weather parameters, wherein calculating the trajectory comprises using a computational fluid dynamics model that generates three-dimensional wind vectors within the outdoor sports venue; and
a display for outputting in real time the calculated trajectory of the ball or calculations based on the calculated trajectory of the ball, wherein the outdoor sports venue is a golf course and the digital model of the outdoor sports venue comprises a plurality of rectangles, each rectangle representing a segment of a golf hole and each rectangle being characterized based on how the rectangle is bounded by canopy, and wherein the computational fluid dynamics model uses linear interpolation to map velocity components from an end of one rectangle to a beginning of a next rectangle.

11. The system of claim 10, further comprising at least one wind sensor positioned at or near an outdoor sports venue, wherein obtaining current weather data further comprises receiving weather data from the at least one wind sensor.

12. The system of claim 11, wherein the at least one wind sensor comprises at least one of a LiDAR device, a SODAR device, and an anemometer.

13. The system of claim 10, further comprising at least one temperature sensor and at least one of a humidity sensor and a barometric pressure sensor.

14. The system of claim 10, further comprising a wind sensor positioned at least ⅛ mile upstream of the outdoor sports venue.

15. The system of claim 10, wherein the system further comprises a data storage containing historical wind data for a location at or near an outdoor sports venue, wherein determining an impact of current weather conditions on movement of the ball at the outdoor sports venue comprises determining a contribution of current wind based on one of actual measured wind speed and a historical average wind speed.

16. The method of claim 10, wherein obtaining current weather data comprises receiving the current weather data from a wireless communication network, the wireless communication network collecting the real-time data sourced from cellular transmission signals including signal attenuation information.

17. A system comprising:
a data storage containing historical wind data for a location at or near an outdoor sports venue;
a data storage that contains wind model data for the outdoor sports venue;
one or more processors, wherein the one or more processors contains a digital model of the outdoor sports venue; and
a machine-readable medium including instructions stored therein, which when executed by the one or more processors, causes the one or more processors to perform operations in real-time comprising:
at the one or more processors, obtaining current weather data comprising wind data, wherein obtaining current weather data comprises receiving the current weather data from at least one wind sensor positioned at or near an outdoor sports venue and if the server stops receiving current weather data from any wind sensor positioned at or near an outdoor sports venue, obtaining current weather data from a wireless communication network, the wireless communication network collecting real-time data sourced from cellular transmission signals including signal attenuation information;
at the one or more processors, calculating a trajectory of a ball at the outdoor sports venue, using the wind model data and current weather data, taking into account impact of current weather conditions on movement of the ball at the outdoor sports venue based on the obtained current weather data for current weather parameters, wherein calculating the trajectory of the ball comprises using a computational fluid dynamics model that generates three-dimensional wind vectors within the outdoor sports venue; and
a display for outputting in real time the calculated trajectory of the ball or calculations based on the calculated trajectory of the ball, wherein the outdoor sports venue is a golf course and the digital model of the outdoor sports venue comprises a plurality of rectangles, each rectangle representing a segment of a golf hole and each rectangle being characterized based on how the rectangle is bounded by canopy, and wherein the computational fluid dynamics model uses linear interpolation to map velocity components from an end of one rectangle to a beginning of a next rectangle.

18. The system of claim 17, further comprising a wind sensor positioned at least ⅛ mile upstream of the outdoor sports venue.

19. The system of claim 17, wherein for each golf hole, a first angle between a first rectangle and a second rectangle is determined, and a second angle between the second rectangle and a third rectangle is determined.

20. The system of claim 17, wherein the display is capable of displaying the calculated trajectory of the ball as compared to a trajectory of the ball without weather impact.

* * * * *